United States Patent
Liu

(10) Patent No.: US 11,523,526 B2
(45) Date of Patent: Dec. 6, 2022

(54) ELECTRONIC DEVICE

(71) Applicant: BEIJING XIAOMI MOBILE SOFTWARE CO., LTD., Beijing (CN)

(72) Inventor: Zhenhua Liu, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 0 days.

(21) Appl. No.: 17/322,750

(22) Filed: May 17, 2021

(65) Prior Publication Data

US 2022/0132687 A1    Apr. 28, 2022

(30) Foreign Application Priority Data

Oct. 27, 2020   (CN) .......................... 202011165867.4

(51) Int. Cl.
  *H05K 5/02*   (2006.01)
  *H05K 5/00*   (2006.01)

(52) U.S. Cl.
  CPC ......... *H05K 5/0217* (2013.01); *H05K 5/0017* (2013.01)

(58) Field of Classification Search
  CPC .. H05K 5/0217; H05K 5/0017; G06F 1/1624; G06F 1/1652; G09F 9/301; H04M 1/0237; H04M 1/0268; H04M 1/0235
  See application file for complete search history.

(56) References Cited

U.S. PATENT DOCUMENTS

| 6,473,938 B1* | 11/2002 | Yoshigashima ....... G06F 1/1616 |
| | | 16/386 |
| 6,922,869 B2* | 8/2005 | Bivens ..................... E05F 3/20 |
| | | 16/342 |
| 10,817,030 B2* | 10/2020 | Pelissier ............... G06F 1/1652 |

(Continued)

FOREIGN PATENT DOCUMENTS

| EP | 3576385 A1 | 12/2019 |
| JP | 2020503589 A | 1/2020 |

(Continued)

OTHER PUBLICATIONS

European Patent Application No. 21176515.1 extended Search and Opinion dated Dec. 7, 2021, 12 pages.

(Continued)

*Primary Examiner* — Hung S. Bui
*Assistant Examiner* — Sagar Shrestha
(74) *Attorney, Agent, or Firm* — Lathrop GPM LLP

(57) ABSTRACT

An electronic device includes a housing assembly, a sliding rail assembly, a reel assembly and a flexible screen. The sliding rail assembly is assembled to the housing assembly and includes a sliding rail including opposite front and rear surfaces. The reel assembly is fixed to an edge of the sliding rail slidable outwards from the housing assembly. The flexible screen includes a winding end, and has a first part provided at the front surface of the sliding rail and fixed to the housing assembly, and a second part extendably and retractably wound around the reel assembly through the (Continued)

winding end. The sliding rail is able to extend the second part of the flexible screen from the reel assembly when slid outwards from the housing assembly and to retract the second part of the flexible screen to the reel assembly when slid towards the housing assembly from an outside.

20 Claims, 31 Drawing Sheets

(56) References Cited

U.S. PATENT DOCUMENTS

| | | | |
|---|---|---|---|
| 10,880,417 B1* | 12/2020 | Song | H04M 1/0237 |
| 11,297,723 B2* | 4/2022 | Ahn | G06F 1/1652 |
| 2007/0006421 A1* | 1/2007 | Park | H04M 1/0237 |
| | | | 16/334 |
| 2007/0094842 A1* | 5/2007 | Chang | G06F 1/1681 |
| | | | 16/330 |
| 2010/0315773 A1* | 12/2010 | Senatori | H05K 5/0234 |
| | | | 361/679.55 |
| 2011/0176260 A1* | 7/2011 | Walters | H04M 1/0268 |
| | | | 361/679.01 |
| 2012/0162876 A1* | 6/2012 | Kim | G06F 1/1652 |
| | | | 361/679.01 |
| 2013/0058063 A1* | 3/2013 | O'Brien | G06F 1/1624 |
| | | | 361/807 |
| 2013/0215565 A1* | 8/2013 | Nakada | G06F 1/1649 |
| | | | 361/679.09 |
| 2015/0116921 A1* | 4/2015 | Hsu | G06F 1/1624 |
| | | | 361/679.27 |
| 2016/0048176 A1* | 2/2016 | Saito | G06F 1/1681 |
| | | | 16/302 |
| 2016/0100478 A1 | 4/2016 | Lee | |
| 2016/0186474 A1* | 6/2016 | Tong | E05F 1/1215 |
| | | | 16/250 |
| 2016/0366772 A1* | 12/2016 | Choi | G06F 1/1675 |
| 2018/0103550 A1* | 4/2018 | Seo | G06F 1/1601 |
| 2018/0103552 A1* | 4/2018 | Seo | G06F 1/1652 |
| 2019/0182947 A1 | 6/2019 | Xiang et al. | |
| 2019/0230803 A1 | 7/2019 | Liao et al. | |
| 2020/0253063 A1* | 8/2020 | Jiang | H04M 1/0268 |
| 2020/0267246 A1* | 8/2020 | Song | H05K 1/148 |
| 2020/0267247 A1 | 8/2020 | Song et al. | |
| 2021/0076517 A1* | 3/2021 | Wang | H04M 1/0268 |
| 2021/0181801 A1* | 6/2021 | Yin | G06F 1/1656 |
| 2021/0373603 A1* | 12/2021 | Feng | G06F 1/1624 |

FOREIGN PATENT DOCUMENTS

| | | |
|---|---|---|
| KR | 20170025520 A | 3/2017 |
| KR | 102111376 B1 | 5/2020 |

OTHER PUBLICATIONS

Japanese Patent Application No. 2021-087542, Office Action dated Jul. 26, 2022, 5 pages.
Japanese Patent Application No. 2021-087542, English translation of Office Action dated Jul. 26, 2022, 5 pages.
Korean Patent Application No. 10-2021-0065236, Office Action dated Jul. 15, 2022, 5 pages.
Korean Patent Application No. 10-2021-0065236, English translation of Office Action dated Jul. 15, 2022, 6 pages.

* cited by examiner

ELECTRONIC DEVICE

CROSS-REFERENCE TO RELATED APPLICATION

This application claims priority to and benefits of Chinese Patent Application Serial No. 202011165867.4, filed with National Intellectual Property Administration of PRC on Oct. 27, 2020, the entire content of which is incorporated herein by reference.

FIELD

The present disclosure relates to a field of electronic devices, and particularly to an electronic device with a display screen.

BACKGROUND

With the development of a flexible screen, screens of electronic devices have more and more abundant forms, such as foldable screens, surround screens, curved screens, or the like. As the volume of electronic devices decreases and the capacity of batteries increases, an electronic device may also take on more flexible design forms. However, the foldable screen capable of providing a display in different sizes has a large volume and is unable to provide satisfactory user experiences. Therefore, it is particularly important to provide an electronic device which is suitable for miniaturization and also meets use requirements of a user for screen sizes.

SUMMARY

An aspect of the present disclosure provides an electronic device, including: a housing assembly; a sliding rail assembly assembled to the housing assembly and including at least one sliding rail, the sliding rail including a front surface and a rear surface opposite to the front surface; at least one reel assembly fixed to an edge of the sliding rail slidable outwards from the housing assembly; and a flexible screen. A first part of the flexible screen is provided at the front surface of the sliding rail and fixed to the housing assembly. The flexible screen includes at least one winding end, and a second part of the flexible screen being extendably and retractably wound around the reel assembly through the winding end. The sliding rail is configured to extend the second part of the flexible screen from the reel assembly when slid outwards from the housing assembly and to retract the second part of the flexible screen to the reel assembly when slid towards the housing assembly from an outside.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of devices and methods consistent with some aspects related to the disclosure as recited in the appended claims.

The terminology used herein is for the purpose of describing particular embodiments only and is not intended to be limiting of the disclosure. Unless defined otherwise, the technical or scientific terms used in the disclosure should have the same meanings as commonly understood by one of ordinary skilled in the art to which the present disclosure belongs. The terms "first", "second" and the like in the description and the claims of the present disclosure do not mean any sequential order, number or importance, but are only used for distinguishing different components. Similarly, the terms "a", "an" and the like do not denote a limitation of quantity, but denote the existence of at least one. Unless otherwise stated, the terms "comprises", "comprising", "includes", "including" and the like mean that the element or object in front of the "comprises", "comprising", "includes" and "including" encompasses the elements or objects and their equivalents illustrated following the "comprises", "comprising", "includes" and "including", but do not exclude other elements or objects. The term "coupled", "connected" or the like is not limited to being connected physically or mechanically, but may include electric connection, direct or indirect.

As used in the description of the present disclosure and the appended claims, "a" and "the" in singular forms mean including plural forms, unless clearly indicated in the context otherwise. It should also be understood that, as used herein, the term "and/or" represents and contains any one or all possible combinations of one or more associated listed items.

Figure 1:
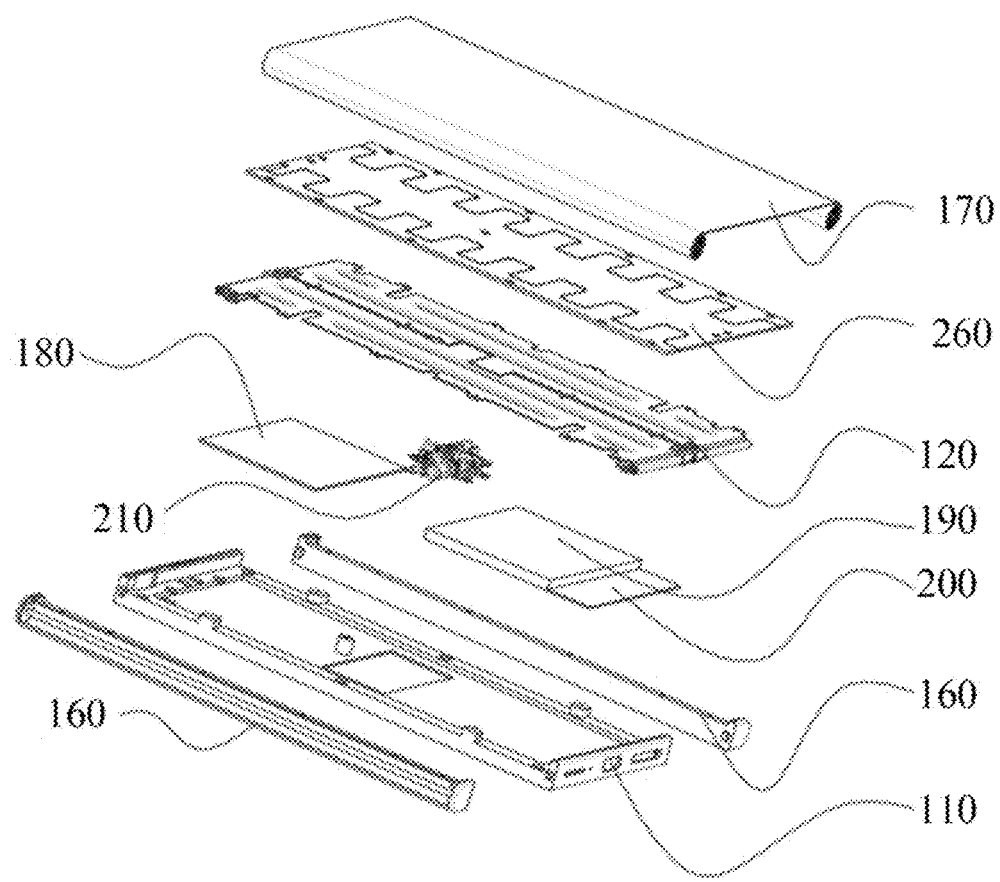
FIG. 1 shows a schematic exploded diagram of an electronic device according to an exemplary embodiment of the present disclosure.
Figure 2:
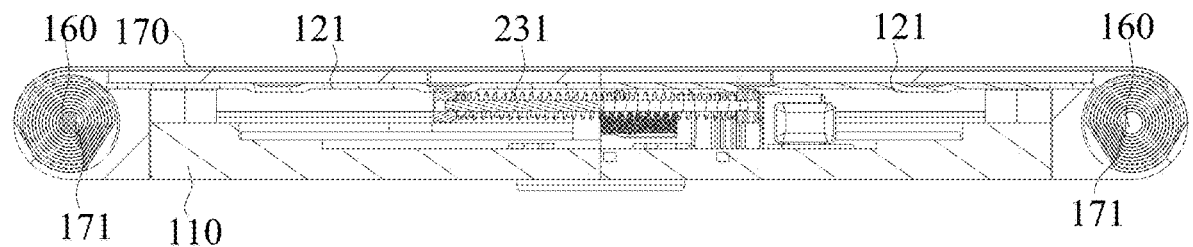
FIG. 2 shows a partial sectional view of an electronic device according to an exemplary embodiment of the present disclosure.
Figure 3:
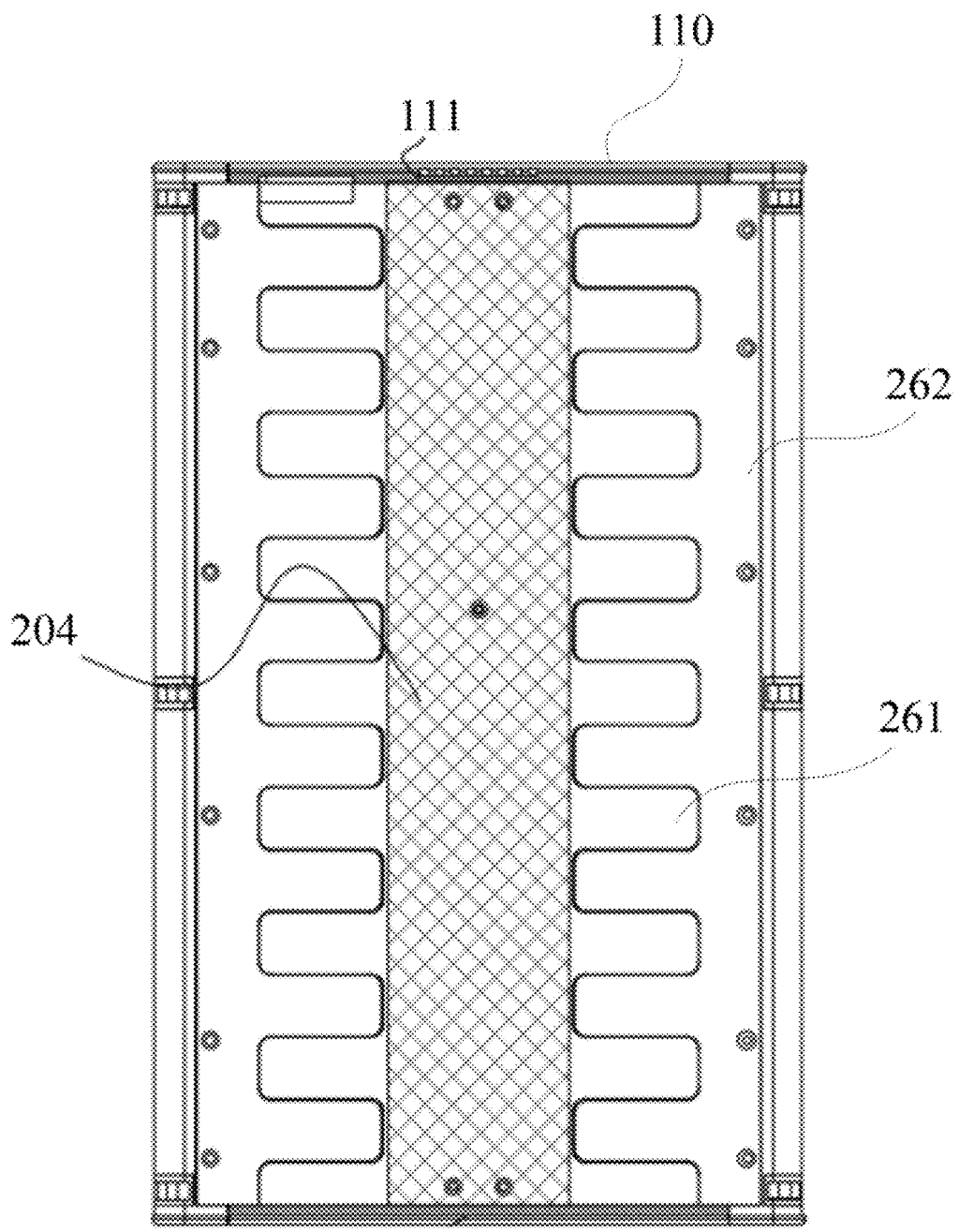
FIG. 3 shows a partial schematic diagram of a front surface of an electronic device according to an exemplary embodiment of the present disclosure.

The electronic device according to the embodiments of the present disclosure includes, but is not limited to, a mobile phone, a tablet computer, an iPad, a digital broadcast terminal, a messaging apparatus, a game console, a medical apparatus, a fitness apparatus, a personal digital assistant, an intelligent wearable apparatus, an intelligent television, a floor sweeping robot, an intelligent sound box, a vehicle-mounted apparatus, or the like. For convenience of understanding, the following drawings are illustrated by taking a mobile phone as an example. FIG. 1 shows a schematic exploded diagram of an electronic device according to an exemplary embodiment of the present disclosure, FIG. 2 shows a partial sectional view of an electronic device according to an exemplary embodiment of the present disclosure, and FIG. 3 shows a partial schematic diagram of a front surface of an electronic device according to an exemplary embodiment of the present disclosure. Referring to FIGS. 1 and 2, the electronic device according to some embodiments of the present disclosure includes a housing assembly 110, a sliding rail assembly 120, at least one reel assembly 160 and a flexible screen 170.

The housing assembly 110 may include a middle frame providing support for components and parts of the electronic device. In embodiments, the housing assembly 110 may be made of a metal material, such as an aluminum alloy, and formed with CNC (Computerized Numerical Control Machine) machining and nano-injection molding processes.

The sliding rail assembly 120 is assembled to the housing assembly 110 and includes at least one sliding rail 121, and the sliding rail 121 includes a front surface and a rear surface opposite to the front surface. Exemplarily, the number of the sliding rails 121 is two, three, four, or the like. When the number of the sliding rails 121 is two, the two sliding rails 121 may be slid towards and away from each other. It should be noted that the rear surface of the sliding rail 121 may face the middle frame.

The reel assembly 160 is fixed to an edge of the sliding rail 121 slidable outwards from the housing assembly 110. For example, the reel assembly 160 is provided at the rear surface of the edge of the sliding rail 121. Part of the flexible screen 170 is wound around the reel assembly 160, and may be extended outwards from the reel assembly 160 or retracted to the reel assembly 160.

Part of the flexible screen 170 is provided at the front surface of the sliding rail 121 and fixed to the housing assembly 110. Referring to FIGS. 2 and 3, the flexible screen 170 includes at least one winding end 171, part of the flexible screen 170 is extendably and retractably wound around the reel assembly 160 through the winding end 171, the flexible screen 170 has an extended state and a retracted state, the sliding rail 121 is slid outwards from the housing assembly 110 to extend part of the flexible screen 170 from the reel assembly 160, such that the flexible screen 170 is extended into the extended state, and the sliding rail 121 is slid towards the housing assembly 110 from the outside to retract part of the flexible screen 170 to the reel assembly 160, such that the flexible screen 170 is retracted into the retracted state. Exemplarily, the flexible screen 170 includes two winding ends 171, the sliding rail assembly 120 includes two sliding rails 121 arranged oppositely, and the number of the reel assemblies 160 is two. A middle portion of the flexible screen 170 is fixed to the housing assembly 110, one winding end 171 of the flexible screen 170 is wound around the reel assembly 160 at the edge of one sliding rail 121, and the other winding end 171 of the flexible screen 170 is wound around the reel assembly 160 at the edge of the other sliding rail 121. Exemplarily, referring to FIG. 3, the housing assembly 110 includes a first region 111 located at an edge of the housing assembly 110, and an edge of part of the flexible screen 170 may be glued to the first region 111 of the housing assembly 110.

Figure 4:
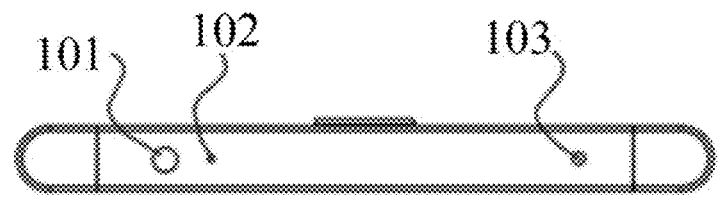
FIG. 4 shows a schematic diagram of a first side surface of an electronic device during retraction of a flexible screen according to an exemplary embodiment of the present disclosure.
Figure 5:
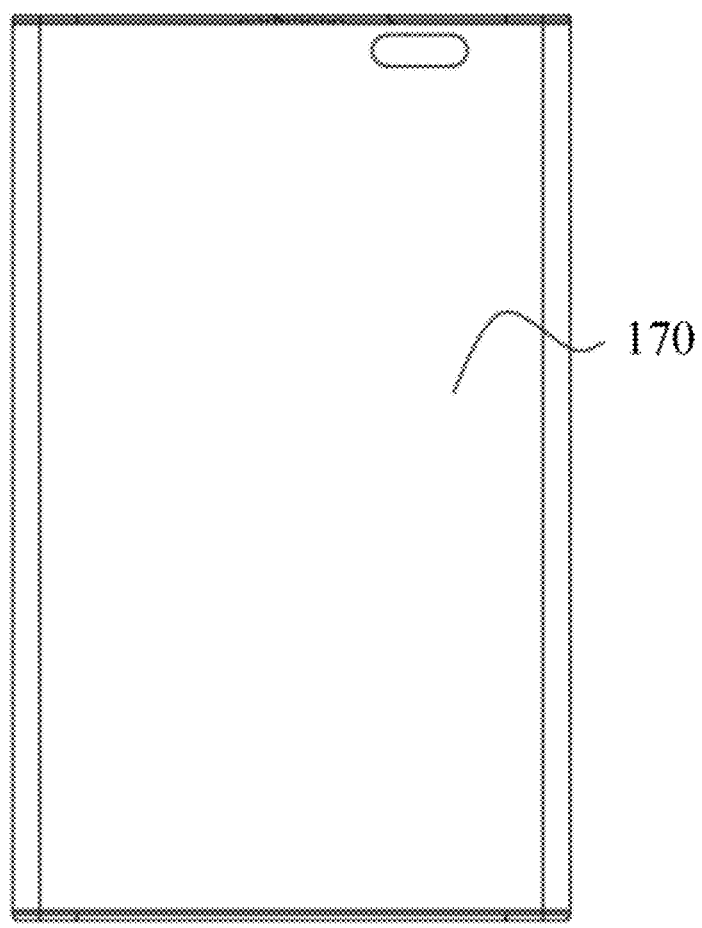
FIG. 5 shows a schematic diagram of a front surface of an electronic device during retraction of a flexible screen according to an exemplary embodiment of the present disclosure.
Figure 6:
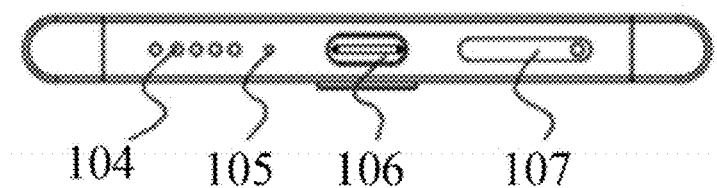
FIG. 6 shows a schematic diagram of a second side surface of an electronic device during retraction of a flexible screen according to an exemplary embodiment of the present disclosure.
Figure 7:
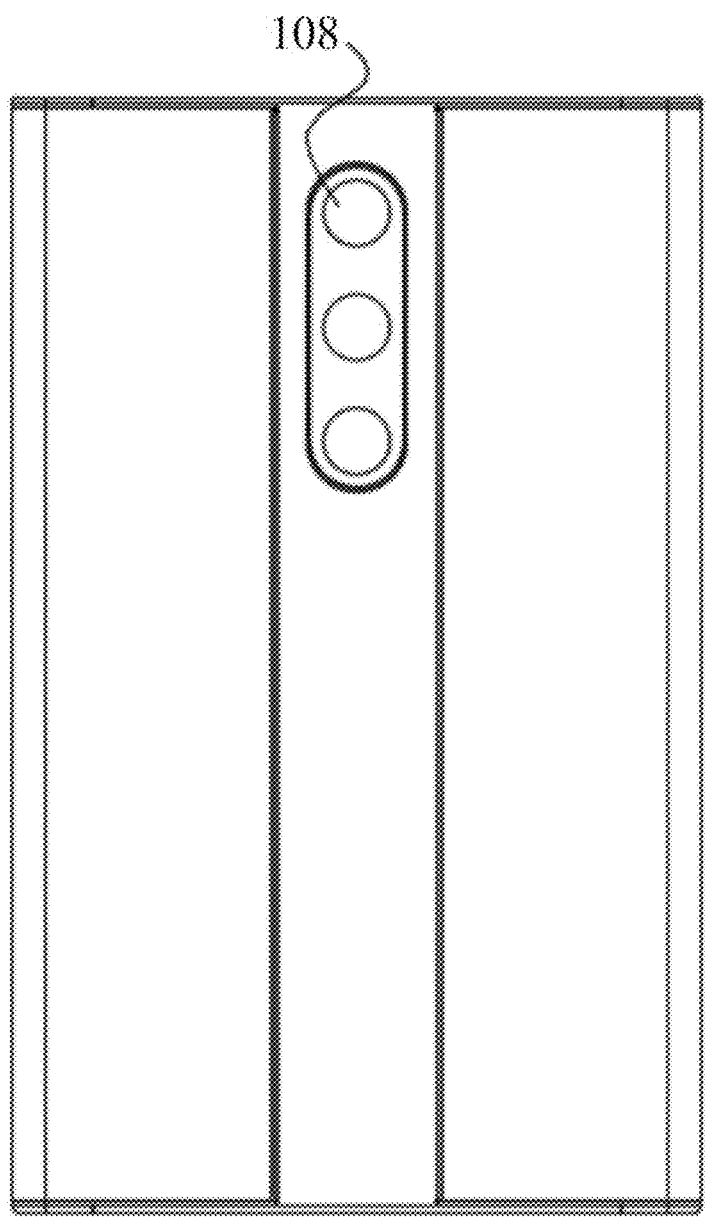
FIG. 7 shows a schematic diagram of a rear surface of an electronic device during retraction of a flexible screen according to an exemplary embodiment of the present disclosure.
Figure 8:
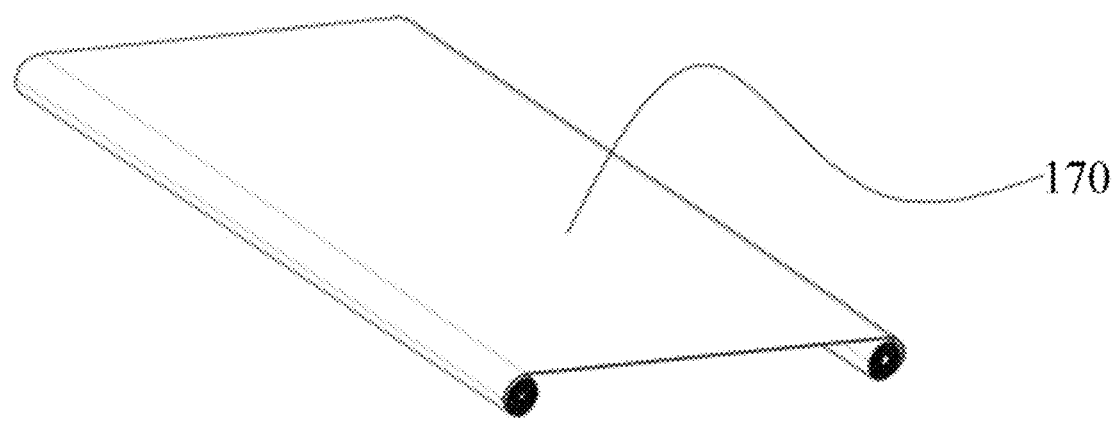
FIG. 8 shows a schematic diagram of a flexible screen in a retracted state according to an exemplary embodiment of the present disclosure.
Figure 9:
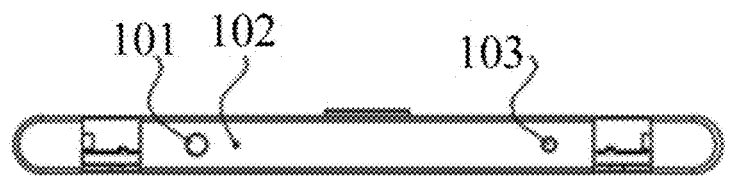
FIG. 9 shows a schematic diagram of a first side surface of an electronic device during extension of a flexible screen according to an exemplary embodiment of the present disclosure.
Figure 10:
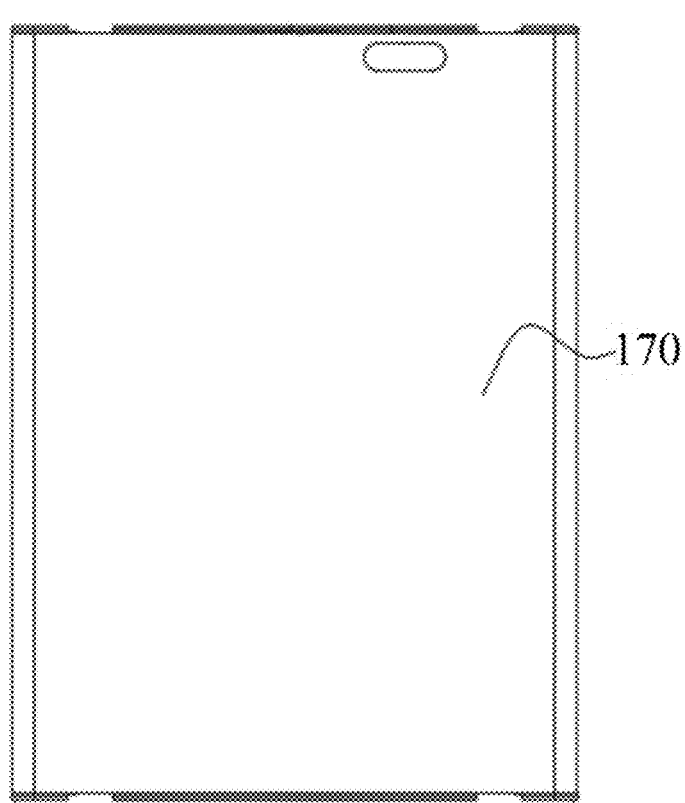
FIG. 10 shows a schematic diagram of a front surface of an electronic device during extension of a flexible screen according to an exemplary embodiment of the present disclosure.
Figure 11:
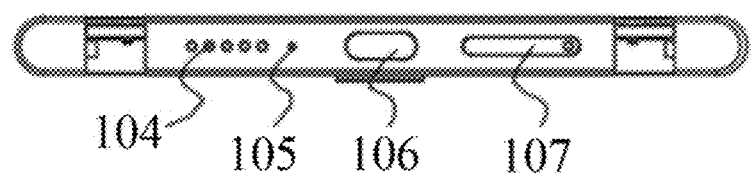
FIG. 11 shows a schematic diagram of a second side surface of an electronic device during extension of a flexible screen according to an exemplary embodiment of the present disclosure.
Figure 12:
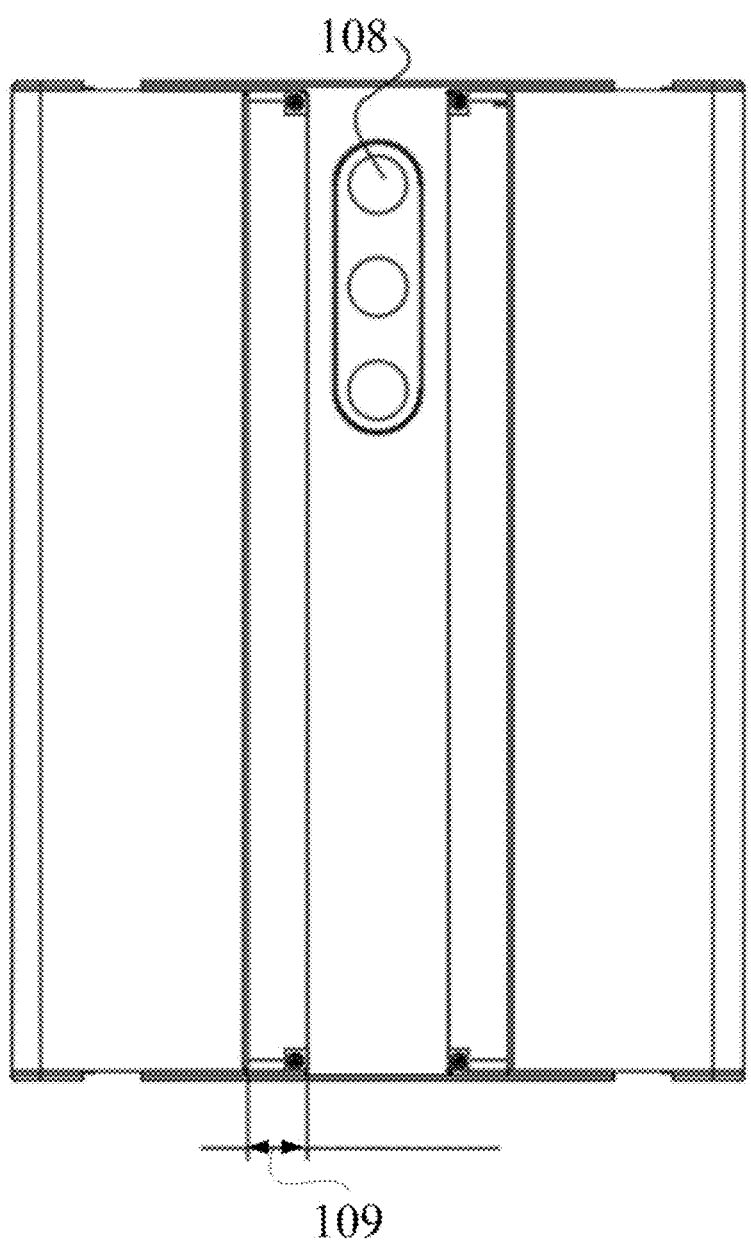
FIG. 12 shows a schematic diagram of a rear surface of an electronic device during extension of a flexible screen according to an exemplary embodiment of the present disclosure.
Figure 13:
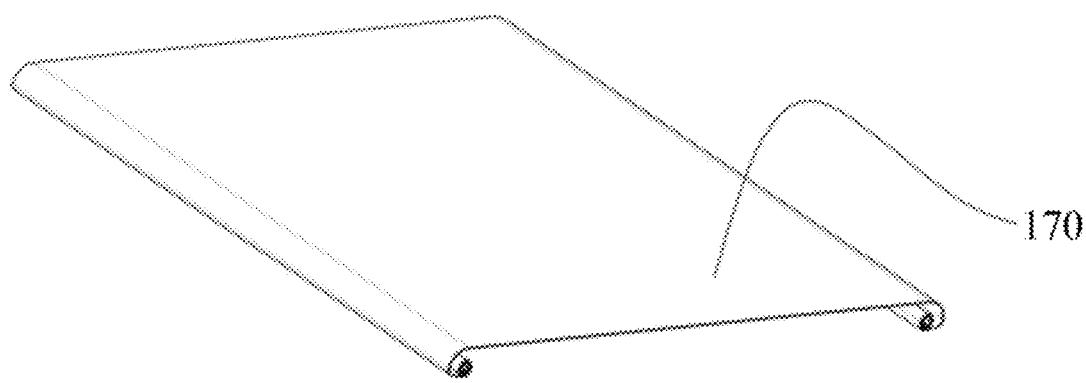
FIG. 13 shows a schematic diagram of a flexible screen in an extended state according to an exemplary embodiment of the present disclosure.

FIG. 4 shows a schematic diagram of a first side surface of an electronic device during retraction of a flexible screen according to an exemplary embodiment of the present disclosure, FIG. 5 shows a schematic diagram of a front surface of an electronic device during retraction of a flexible screen according to an exemplary embodiment of the present disclosure, FIG. 6 shows a schematic diagram of a second side surface of an electronic device during retraction of a flexible screen according to an exemplary embodiment of the present disclosure, FIG. 7 shows a schematic diagram of a rear surface of an electronic device during retraction of a flexible screen according to an exemplary embodiment of the present disclosure, FIG. 8 shows a schematic diagram of a flexible screen 170 in a retracted state according to an exemplary embodiment of the present disclosure, FIG. 9 shows a schematic diagram of a first side surface of an electronic device during extension of a flexible screen according to an exemplary embodiment of the present disclosure, FIG. 10 shows a schematic diagram of a front surface of an electronic device during extension of a flexible screen according to an exemplary embodiment of the present disclosure, FIG. 11 shows a schematic diagram of a second side surface of an electronic device during extension of a flexible screen according to an exemplary embodiment of the present disclosure; FIG. 12 shows a schematic diagram of a rear surface of an electronic device during extension of a flexible screen according to an exemplary embodiment of the present disclosure, and FIG. 13 shows a schematic diagram of a flexible screen 170 in an extended state according to an exemplary embodiment of the present disclosure. Referring to FIG. 4, the first side surface of the electronic device is provided with a headphone jack 101, a first microphone hole 102, and an infrared function lamp 103. Referring to FIG. 5, the flexible screen 170 has a size for a general use state (such as a general use state of a mobile phone). Referring to FIG. 6, a speaker sound outlet hole 104, a second microphone hole 105, a USB interface 106, and a SIM card holder 107 are provided at the second side surface of the electronic device. Referring to FIG. 7, the rear surface of the electronic device is provided with a camera module 108. Referring to FIG. 8, a greater part of the flexible screen 170 is wound at both ends thereof. Referring to FIGS. 4 to 8, when the flexible screen 170 is in the retracted state, the electronic device may be in the general use state, and in this case, the electronic device has a small volume, such as a normal use state of a mobile phone. With reference to FIGS. 9 to 13, the first side surface of the electronic device is extended, the flexible screen is extended, the second side surface of the electronic device is extended, and the rear surface is extended. When the flexible screen 170 is in the extended state, compared with the retracted state of the flexible screen 170, an effective use area of the flexible screen 170 is increased to improve use experiences of a user. For example, a screen of a mobile phone may be formed into a screen size for a tablet computer.

The electronic device may further include a first circuit board 180, a battery assembly 190, and a second circuit board 200, the first circuit board 180 may be configured as a main board, and the second circuit board 200 may be configured as a battery protection board, and is coupled to the battery assembly 190.

In the electronic device according to the embodiments of the present disclosure, the reel assembly 160 is fixed to the edge of the sliding rail 121 slidable outwards from the housing assembly 110, part of the flexible screen 170 is provided at the front surface of the sliding rail 121 and fixed to the housing assembly 110, the winding end 171 is wound around the reel assembly 160, and when the sliding rail 121 is slid outwards from the housing assembly 110, part of the flexible screen 170 is extended from the reel assembly 160, and then, the flexible screen 170 is in the extended state. When the sliding rail 121 is slid from the outside to the housing assembly 110, part of the flexible screen 170 is retracted to the reel assembly 160, and then, the flexible screen 170 is in the retracted state. The flexible screen 170 of the electronic device may be extended and retracted, such that a user may conveniently use screens with different sizes, thus improving user experiences; and compared with a foldable screen, the electric device has a small volume and mass, and is convenient for the user to carry.

Figure 14:
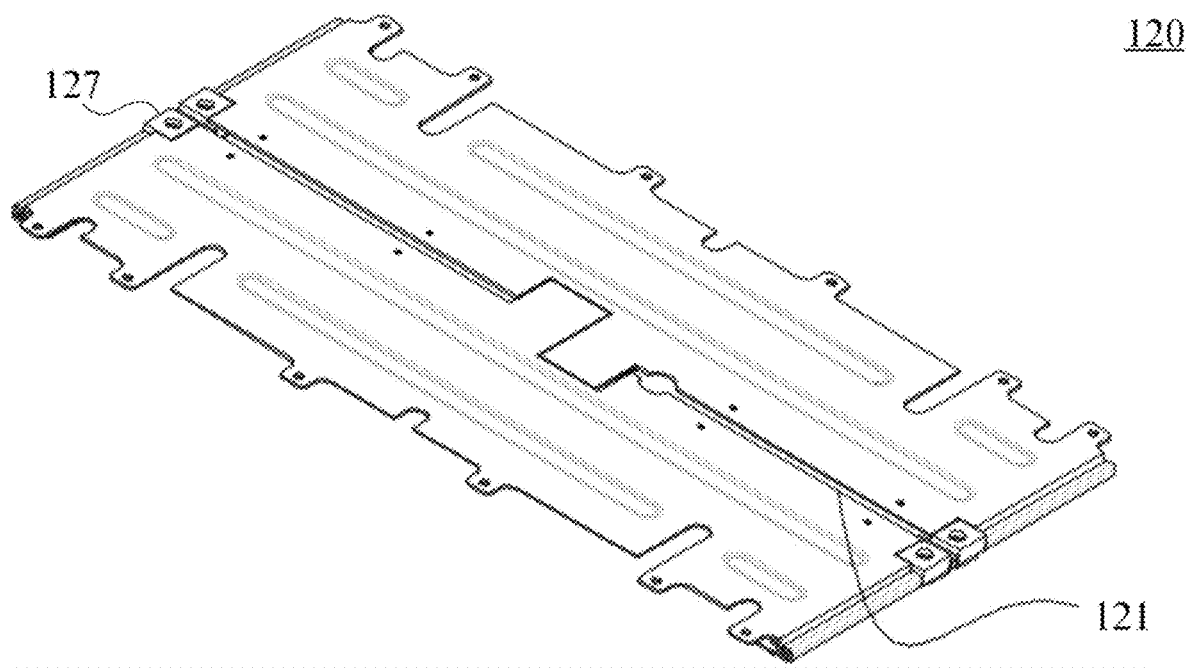
FIG. 14 shows a schematic structural diagram of a sliding rail assembly in a retracted state according to an exemplary embodiment of the present disclosure.
Figure 15:
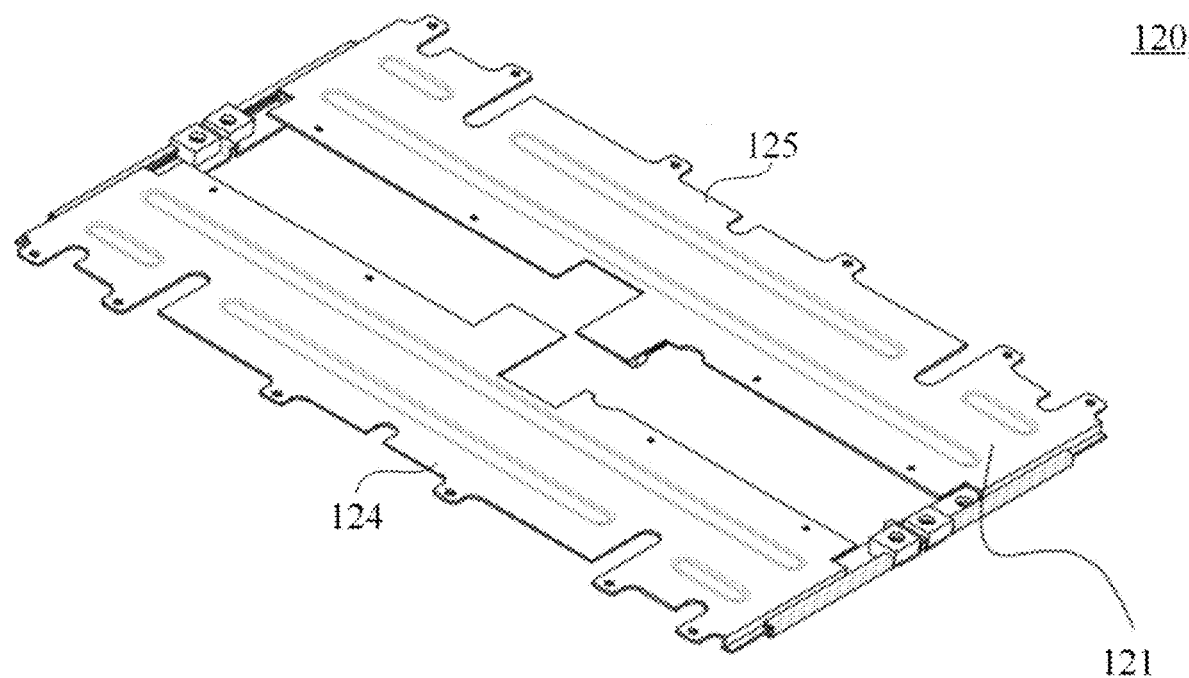
FIG. 15 shows a schematic structural diagram of a sliding rail assembly in an extended state according to an exemplary embodiment of the present disclosure.
Figure 16:
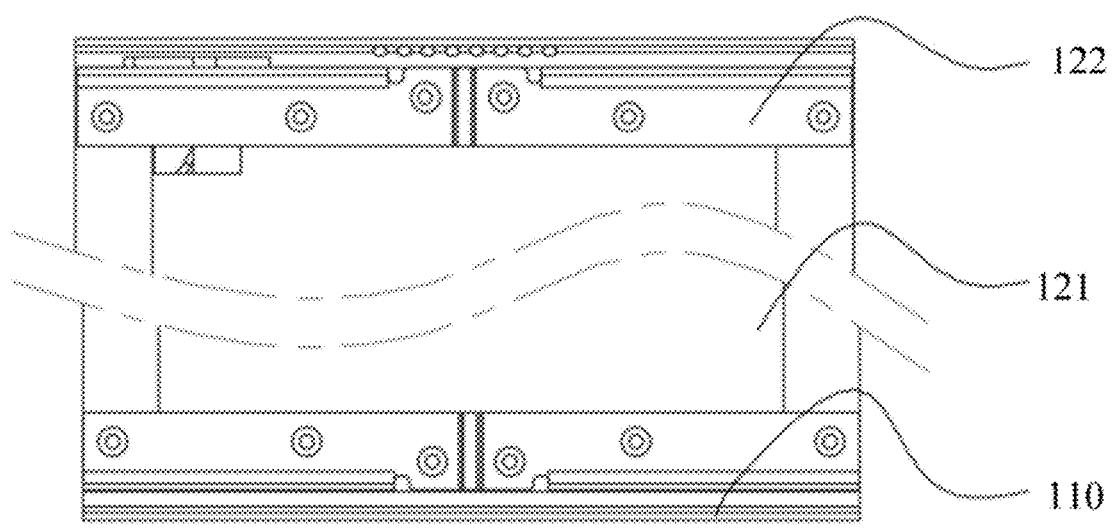
FIG. 16 shows a schematic diagram of fitting between a sliding rail assembly and a housing assembly according to an exemplary embodiment of the present disclosure.
Figure 17:
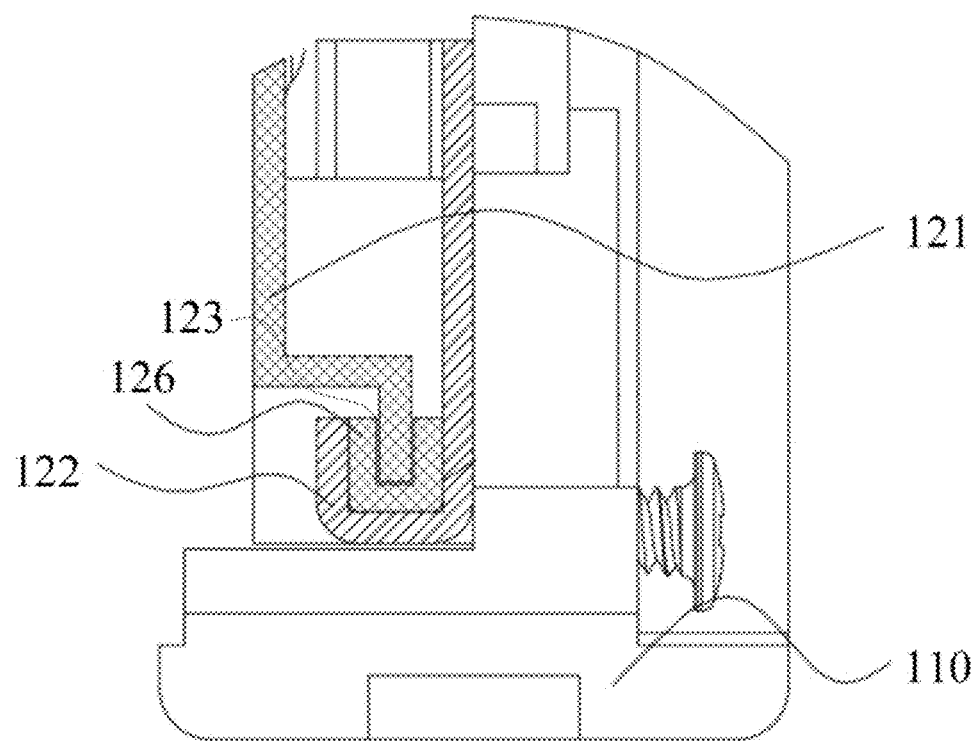
FIG. 17 shows a partial sectional view of fitting of a sliding rail assembly and a housing assembly according to an exemplary embodiment of the present disclosure.

FIG. 14 shows a schematic structural diagram of a sliding rail assembly 120 in a retracted state according to an exemplary embodiment of the present disclosure, FIG. 15 shows a schematic structural diagram of a sliding rail assembly 120 in an extended state according to an exemplary embodiment of the present disclosure, FIG. 16 shows a schematic diagram of fitting between a sliding rail assembly 120 and a housing assembly 170 according to an exemplary embodiment of the present disclosure, and FIG. 17 shows a partial sectional view of fitting of a sliding rail assembly 120 and a housing assembly 110 according to an exemplary embodiment of the present disclosure. In some embodiments, referring to FIGS. 14 to 17, the sliding rail assembly 120 further includes at least one fixing member 122 fixed to the housing assembly 110 and provided with a first sliding groove 123, and the sliding rail 121 has an end slidably limited in the first sliding groove 123. The first sliding groove 123 provides sliding guidance for a sliding action of the sliding rail 121. Exemplarily, the sliding rail assembly 120 includes a first sliding rail 124 and a second sliding rail 125 arranged oppositely as well as two fixing members 122 arranged oppositely. The first and second sliding rails 124, 125 are limited between the two fixing members 122, may be slid towards each other to make the flexible screen 170 in the retracted state, and may also be slid away from each other to make the flexible screen 170 in the extended state.

Exemplarily, with continued reference to FIG. 17, the first sliding groove 123 includes a first lubrication layer 126 forming an inner wall of the first sliding groove 123. Thus, the sliding rail 121 is facilitated to slide smoothly in the first sliding groove 123 of the fixing member 122. Exemplarily, a groove of the fixing member 122 may be formed by stamping stainless steel, a material of the first lubrication layer 126 includes polyoxymethylene (also called POM), and the lubrication layer is formed by injecting the polyoxymethylene into the groove, giving a lubrication effect to the inner wall of the first sliding groove 123.

Further, in some embodiments, with continued reference to FIGS. 14 and 15, the sliding rail assembly 120 further includes a buffer limiting member 127 provided at the fixing member 122 and configured to abut against the sliding rail 121 sliding from the outside to the housing assembly 110, thus limiting a maximum stroke of the sliding rail 121 sliding towards the housing assembly 110. The buffer limiting member 127 may include a plastic member which not only limits the sliding rail 121, but also enables the sliding rail 121 and the buffer limiting member 127 to stably abut against each other without wearing the sliding rail 121. Exemplarily, two buffer limiting members 127 may be provided at the fixing member 122, fixed to a middle portion of the fixing member 122, and configured to abut against the first and second sliding rails 124, 125 respectively.

Figure 18:
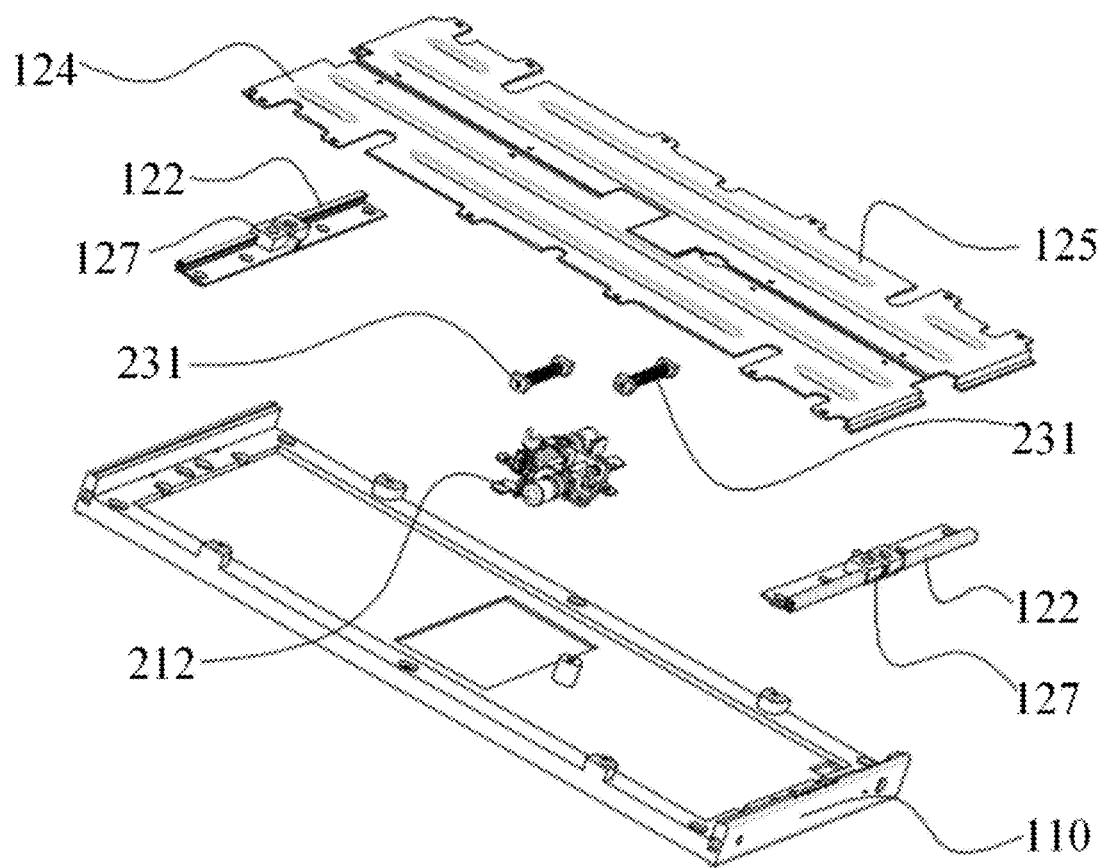
FIG. 18 shows a schematic exploded diagram of fitting among a sliding rail assembly, a housing assembly and a driving assembly according to an exemplary embodiment of the present disclosure.
Figure 19:
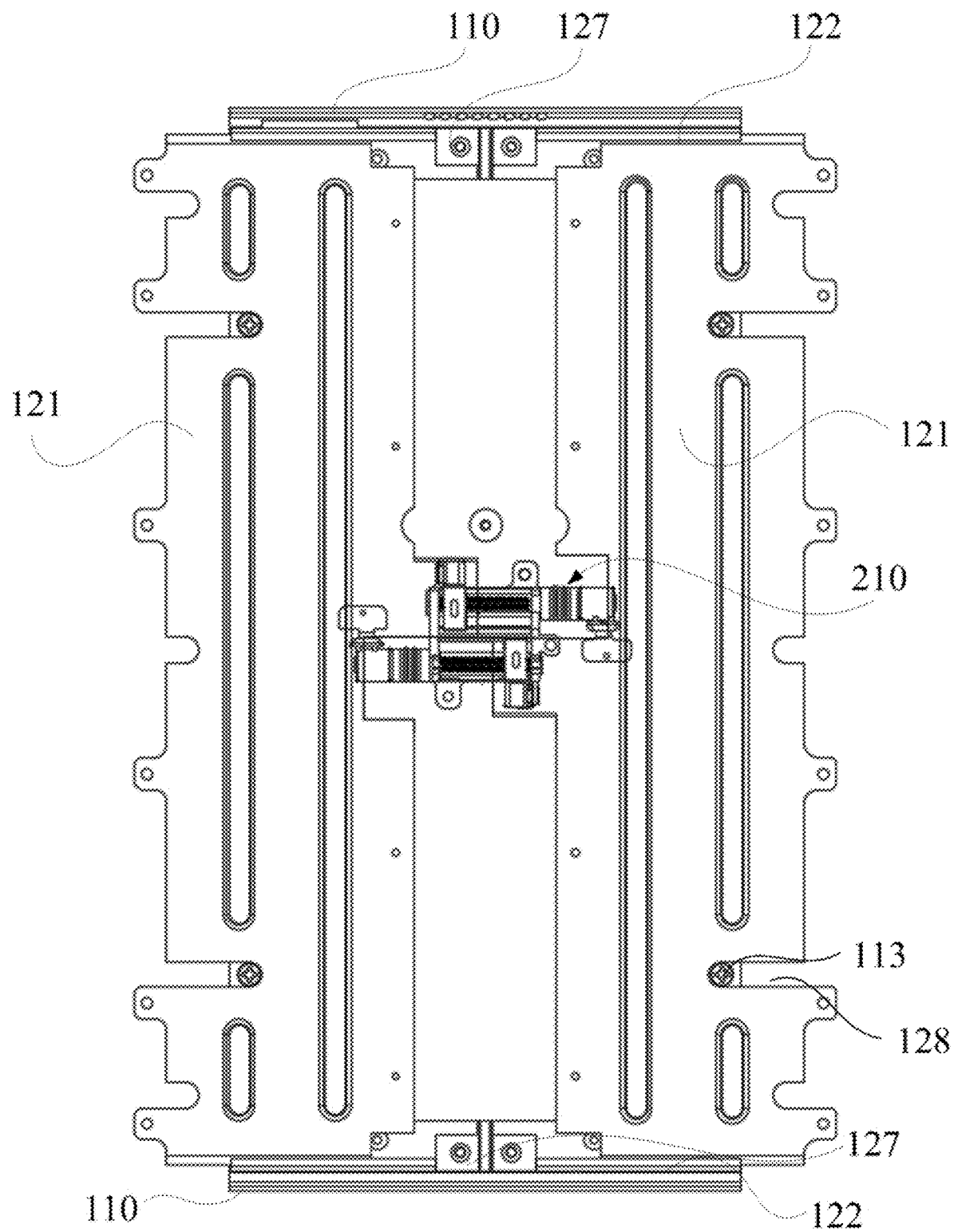
FIG. 19 shows a schematic diagram of fitting among a sliding rail assembly, a housing assembly and a driving assembly according to an exemplary embodiment of the present disclosure.

FIG. 18 shows a schematic exploded diagram of a sliding rail assembly 120, a housing assembly 110 and a driving assembly 210 according to an exemplary embodiment of the present disclosure, and FIG. 19 shows a schematic diagram of fitting among a sliding rail assembly 120, a housing assembly 110 and a driving assembly 210 according to an exemplary embodiment of the present disclosure. In some embodiments, with reference to FIGS. 18 to 20, an edge of the housing assembly 110 is provided with a limiting portion 113, and the sliding rail 121 is provided with a limiting groove 128, and slid outwards from the housing assembly 110 to limit the limiting portion 113 in the limiting groove 128. Thus, the maximum stroke of the sliding rail 121 slidable outwards from the housing assembly 110 is limited by the fitting of the limiting portion 113 and the limiting groove 128, and the sliding rail 121 is prevented from being separated from the housing assembly 110. The limiting portion 113 may have a protruding structure, or the limiting portion 113 is configured as a screw fixed to the housing component 110.

Figure 20:
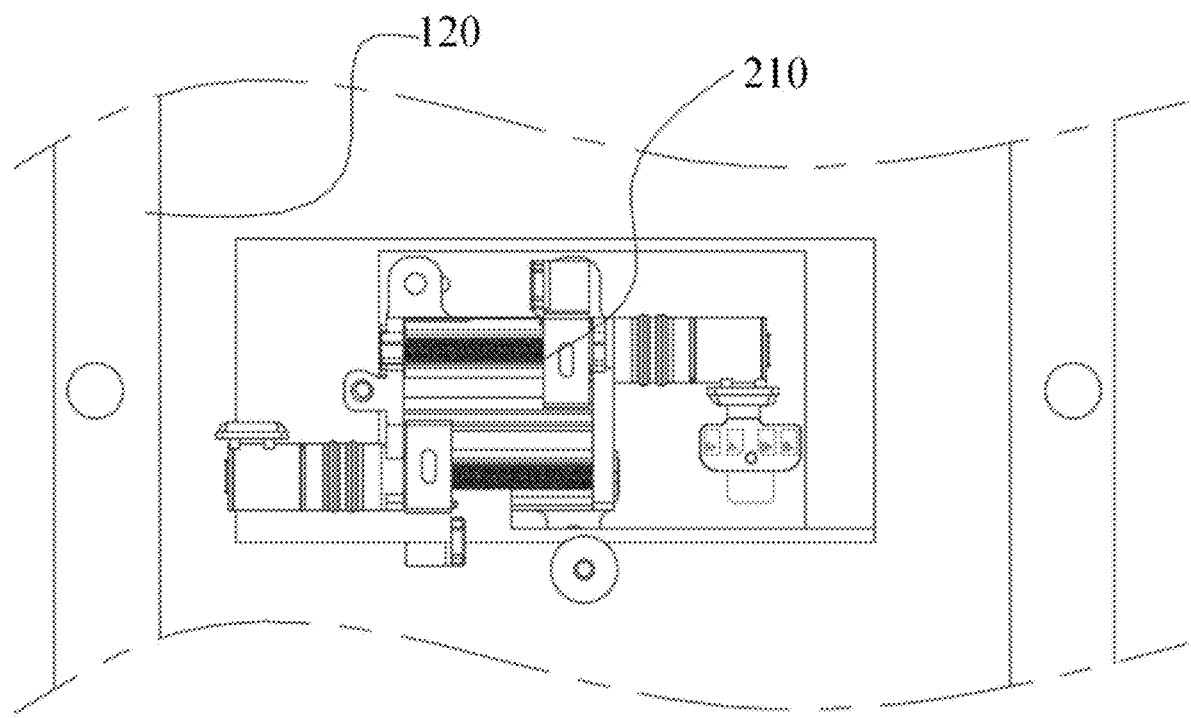
FIG. 20 shows a schematic diagram of fitting between a driving assembly and a sliding rail assembly according to an exemplary embodiment of the present disclosure.

FIG. 20 shows a schematic diagram of fitting between a driving assembly 210 and a housing assembly 110 according to an exemplary embodiment of the present disclosure. In some embodiments, with continued reference to FIGS. 19 and 20, the electronic device further includes the driving assembly 210 assembled to the housing assembly 110, coupled to the sliding rail 121, and configured to drive the sliding rail 121 to slide. Thus, the sliding rail 121 may be automatically controlled to slide by the driving assembly 210, and may also be stably slid to any position within the maximum stroke, such that the flexible screen 170 may be extended into various sizes to improve the user experiences.

Figure 21:
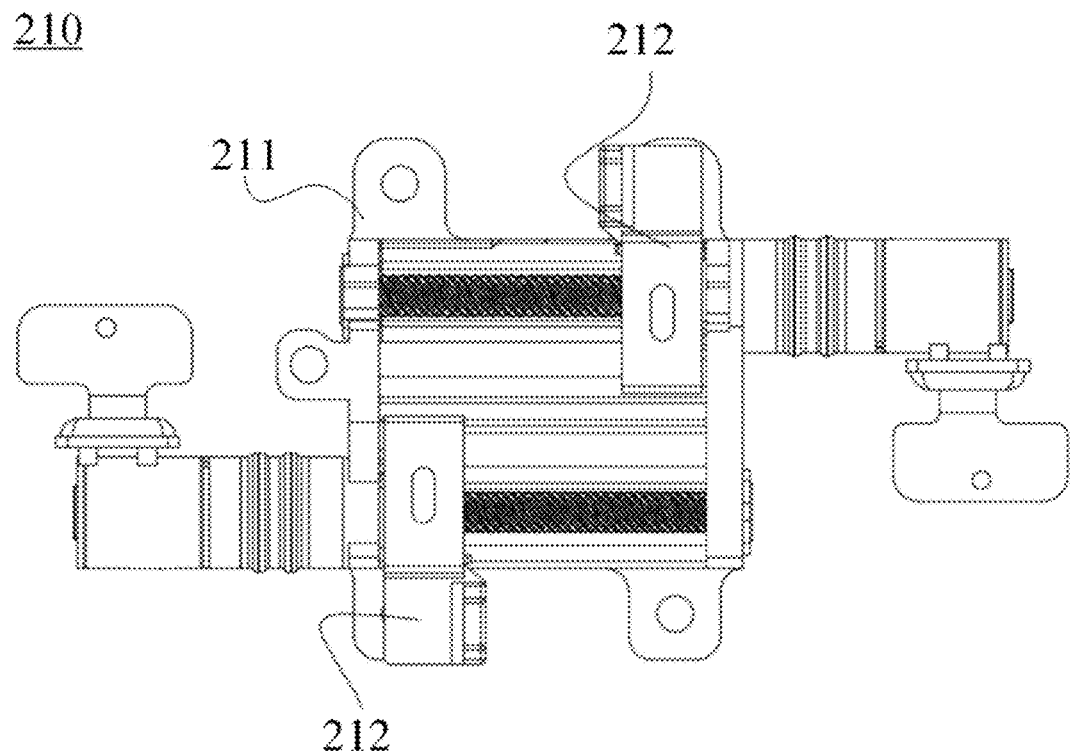
FIG. 21 shows a partial schematic structural diagram of a driving assembly according to an exemplary embodiment of the present disclosure.

FIG. 21 shows a partial schematic structural diagram of a driving assembly 210 according to an exemplary embodiment of the present disclosure. In some embodiments, with reference to FIGS. 20 and 21, the driving assembly 210 includes a driving assembly support 211 fixed to the housing assembly 110 and at least one driving unit 212 assembled to the driving assembly support 211 and configured to drive the sliding rail 121 to slide. By fixing the driving assembly support 211 to the housing assembly 110, the driving unit 212 assembled to the driving assembly support 211 stably drives the sliding rail 121 to slide.

The following two classes of embodiments for the structure of the driving assembly 210 are given in the present disclosure.

Figure 22:
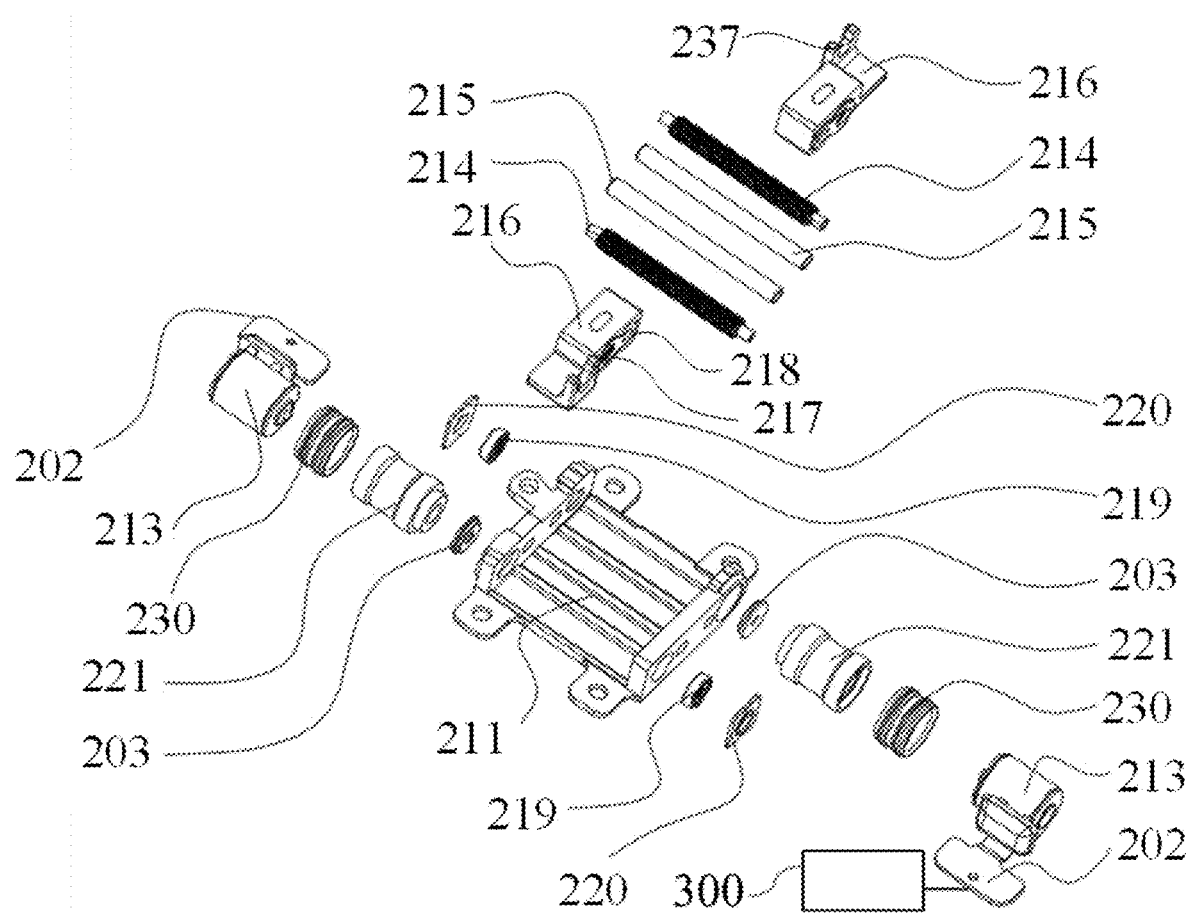
FIG. 22 shows a partial schematic exploded diagram of a driving assembly according to an exemplary embodiment of the present disclosure.

FIG. 22 shows a partial schematic exploded diagram of a driving assembly 210 according to an exemplary embodiment of the present disclosure. In the first class of embodiments, referring to FIGS. 21 and 22, the driving unit 212 includes a first driving member 213, a first transmission lead screw 214, a first guide rod 215 and a first pushing member 216. The first transmission lead screw 214 and the first guide rod 215 are assembled to the driving assembly support 211, the first driving member 213 is coupled to an end of the first transmission lead screw 214, and the first driving member 213 is configured to drive the first transmission lead screw 214 to rotate. The first pushing member 216 is provided with a first transmission hole 217 and a first sliding hole 218, the first transmission hole 217 is drivingly coupled to the first transmission lead screw 214, the first sliding hole 218 is slidably fitted over the first guide rod 215, and the first pushing member 216 is configured to push the sliding rail 121 to slide. When the first driving member 213 drives the first transmission lead screw 214 to rotate, the rotating first transmission lead screw 214 drives the first pushing member 216 to move linearly along an axial direction of the first transmission lead screw 214, the first guide rod 215 provides guidance for the first pushing member 216 to ensure that the first pushing member 216 is moved stably, and the first pushing member 216 drives the sliding rail 121 to slide. It may be understood that an inner wall of the first transmission hole 217 is provided with a transmission thread fitted with the first transmission lead screw 214 to achieve linear movement under the driving action of the first transmission lead screw 214. Exemplarily, the first pushing member 216 may employ powder metallurgy and plastic double-shot molding processes, and plastic may be polyoxymethylene (also called POM), and is formed at the inner wall of the first transmission hole 217 for lubrication, thus facilitating transmission between the first transmission hole 217 and the first transmission lead screw 214.

Exemplarily, the first driving member 213 includes a stepping motor. The stepping motor is configured as an open-loop control stepping motor which converts an electrical pulse signal into angular displacement or linear displacement. Under a non-overload condition, a rotating speed and a stopping position of the stepping motor only depend on a frequency and a pulse number of the pulse signal and are not influenced by a load change. When a control chip of the stepping motor receives one pulse signal, the stepping motor is driven to be rotated by a fixed angle in a set direction, and a driving shaft of the stepping motor is rotated step by step by the fixed angle. The angular displacement may be controlled by controlling the number of the pulses, so as to achieve a purpose of accurate positioning. The rotating speed and acceleration of the stepping motor may be controlled by controlling the pulse frequency, so as to achieve purposes of speed regulation and rotating torque output. The first driving member 213 may be coupled to a flexible circuit board 202.

Exemplarily, with continued reference to FIG. 22, an end of the first transmission lead screw 214 may be fitted in a first bearing 219, and the first bearing 219 may be assembled to the driving assembly support 211 by a first bearing pressing plate 220, such that the first transmission lead screw 214 may be rotated. The first bearing pressing plate 220 is configured to press the first bearing 219, and when not fixed by spot welding, the first bearing 219 may be pressed by the first bearing pressing plate 220 which may be fixed on the first driving assembly support 211 by spot welding. The first bearing pressing plate 220 may be made of stainless steel.

In some embodiments, with continued reference to FIG. 22, the driving unit 212 further includes a first reduction gearbox 221 having an end coupled to the first transmission lead screw 214, and the other end coupled to the first driving member 213. The first reduction gearbox 221 may amplify torque of the first driving member 213 to drive the first transmission lead screw 214 to rotate, thereby causing the first pushing member 216 to move linearly along the first transmission lead screw 214. The first reduction gearbox 221 may be coupled to the first transmission lead screw 214 through a first lead screw bushing 203.

Figure 23:
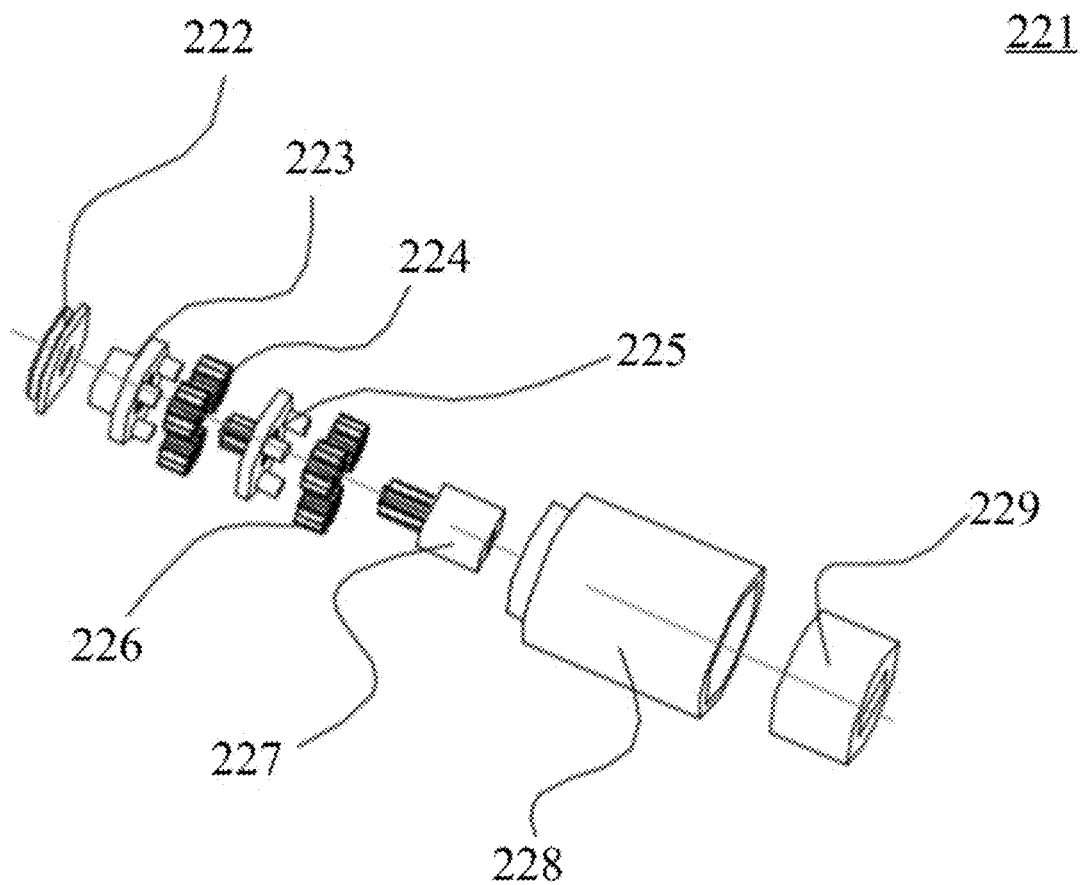
FIG. 23 shows an exploded view of a first reduction gearbox according to an exemplary embodiment of the present disclosure.

FIG. 23 shows an exploded view of a first reduction gearbox 221 according to an exemplary embodiment of the present disclosure. In some embodiments, referring to FIG. 23, the first reduction gearbox 221 includes a second lead screw bushing 222, a secondary gear carrier 223, a secondary planetary gear 224, a primary gear carrier 225, a primary planetary gear 226, a motor gear 227, a gear fixing ring 228 and a motor gear bushing 229. The secondary planetary gear 224 is assembled to the secondary gear carrier 223, the primary planetary gear 226 is assembled to the primary gear carrier 225, the primary gear carrier 225, the secondary gear carrier 223 and the motor gear 227 are all assembled in the gear fixing ring 228, the motor gear 227 is fixedly coupled to an output shaft of the first driving member 213, the secondary gear carrier 223 is fixed to the first transmission lead screw 214, the torque of the first driving member 213 is reduced by the two-stage planetary gears, and a torque which is several times or dozens of times larger than the torque of the first driving member 213 is output to the first transmission lead screw 214 to drive the first transmission lead screw 214 to rotate.

In some embodiments, with continued reference to FIG. 22, the driving unit 212 further includes a first shock absorption member 230 fitted over an outer surface of the first reduction gearbox 221 to absorb noises and shocks. Exemplarily, the first shock absorption member 230 is molded by injecting a soft rubber material.

Figure 24:
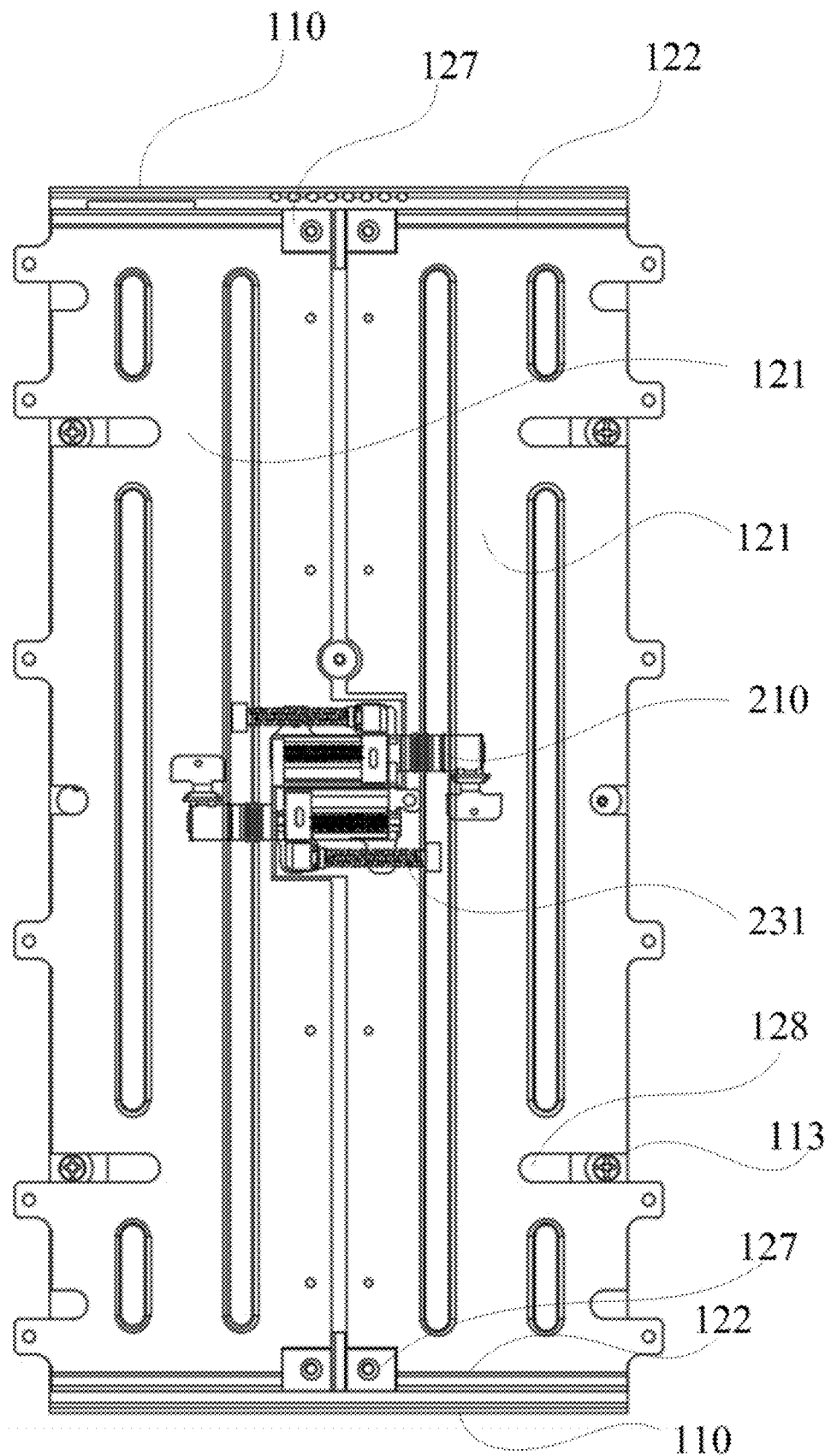
FIG. 24 shows a schematic diagram in which a sliding rail assembly and a driving assembly are assembled to a housing assembly according to an exemplary embodiment of the present disclosure.
Figure 25:
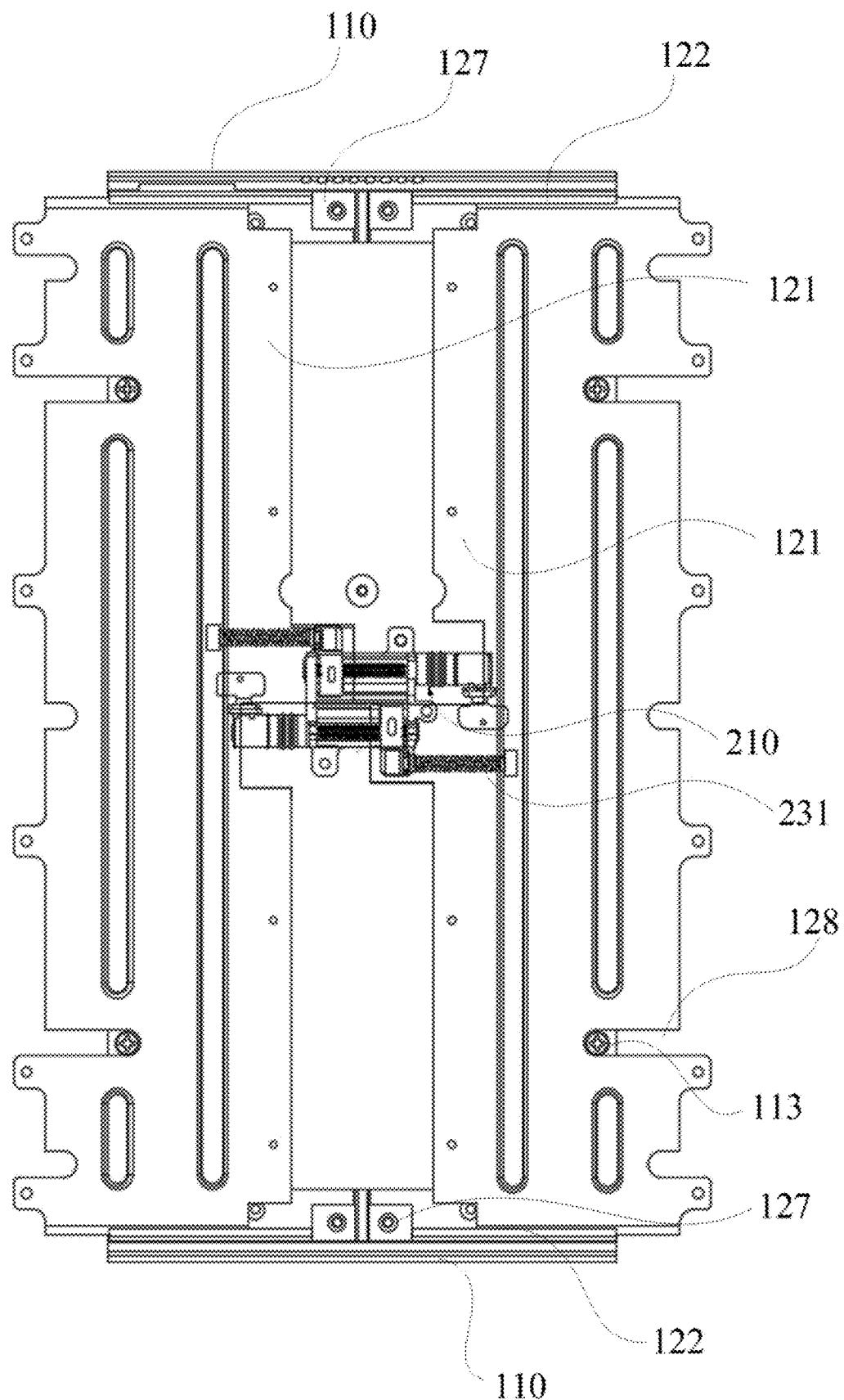
FIG. 25 shows a schematic diagram in which a sliding rail assembly and a driving assembly are assembled to a housing assembly according to an exemplary embodiment of the present disclosure.
Figure 26:
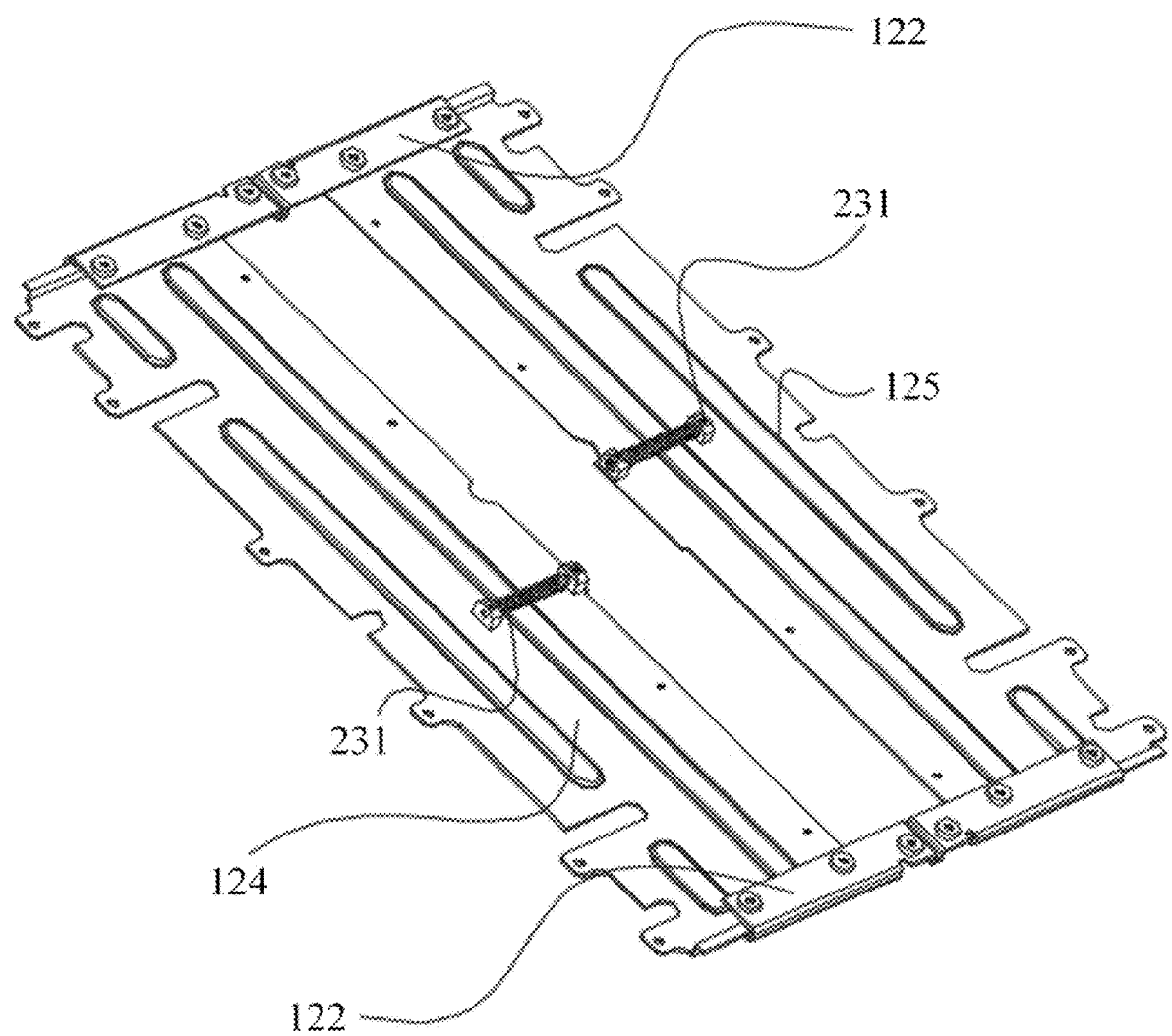
FIG. 26 shows a schematic diagram of fitting between an elastic buffer assembly and a sliding rail according to an exemplary embodiment of the present disclosure.
Figure 27:
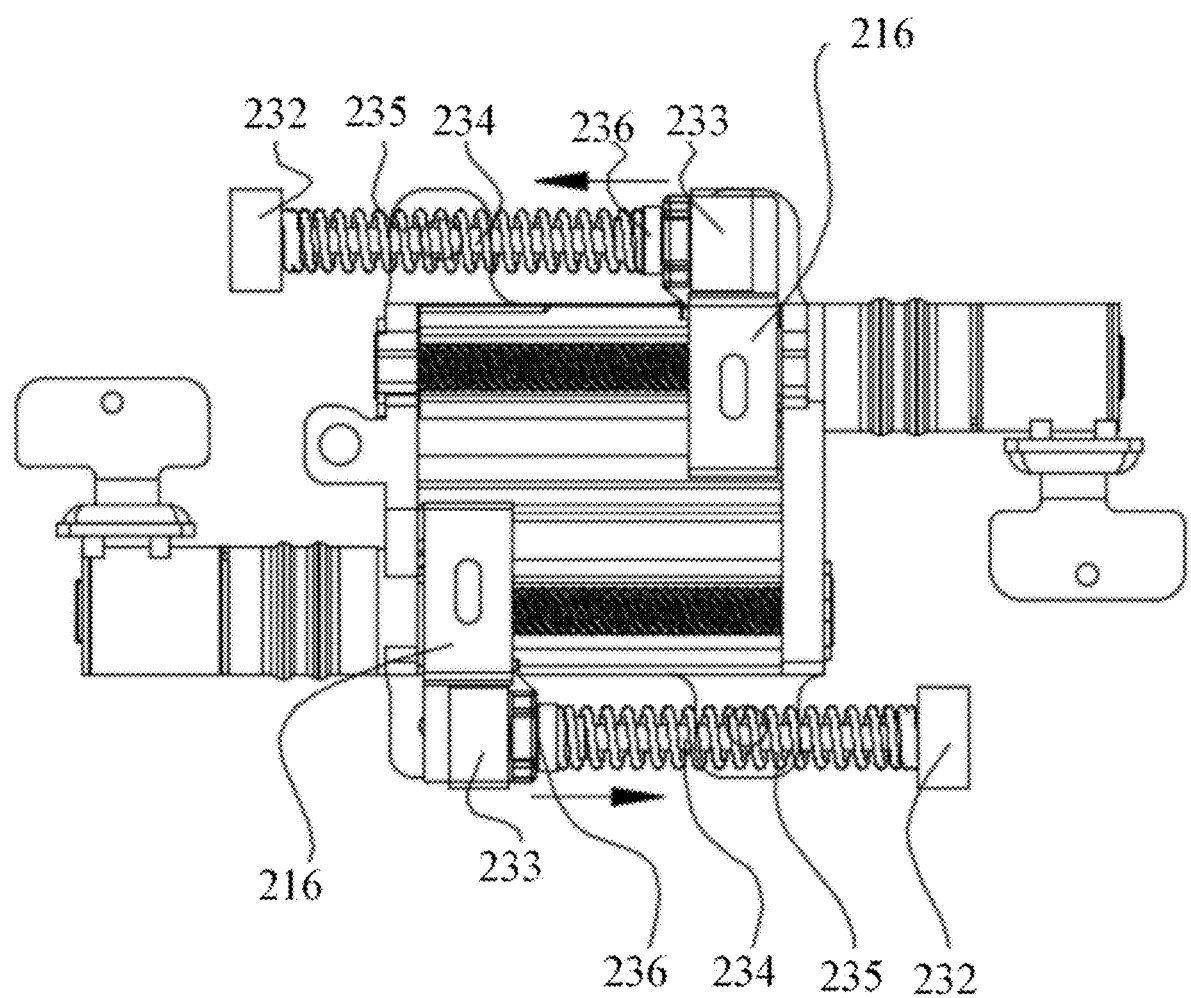
FIG. 27 shows a schematic structural diagram of a driving assembly according to an exemplary embodiment of the present disclosure.

FIG. 24 shows a schematic diagram in which a sliding rail assembly 120 and a driving assembly 210 are assembled to a housing assembly 110 according to an exemplary embodiment of the present disclosure, FIG. 25 shows a schematic diagram in which a sliding rail assembly 120 and a driving assembly 210 are assembled to a housing assembly 110 according to an exemplary embodiment of the present disclosure, FIG. 26 shows a schematic diagram of fitting between an elastic buffer assembly 231 and a sliding rail 121 according to an exemplary embodiment of the present disclosure, and FIG. 27 shows a schematic structural diagram of a driving assembly 210 according to an exemplary embodiment of the present disclosure. In some embodiments, with reference to FIGS. 24 to 27, the driving assembly 210 further includes at least one elastic buffer assembly 231 fixed to the sliding rail 121 and coupled to the driving unit 212. The elastic buffer assembly 231 has a buffer effect, and the driving unit 212 pushes the elastic buffer assembly 231 to enable the sliding rail 121 to stably slide.

In some embodiments, with continued reference to FIG. 27, the elastic buffer assembly 231 includes a first fixed portion 232, a second fixed portion 233, a third guide rod 234, and a second elastic member 235. The first and second fixed portions 232, 233 are fixed to the sliding rail 121, the third guide rod 234 is fixed between the first and second fixed portions 232, 233, the second elastic member 235 is fitted over the third guide rod 234, and the driving unit 212 pushes the second elastic member 235 to extend and retract on the third guide rod 234. Thus, the driving unit 212 pushes the second elastic member 235 to extend and retract on the third guide rod 234, such that the second elastic member 235 applies an acting force to the first or second fixed portion 232, 233, thereby stably pushing the sliding rail 121 to slide. Exemplarily, an end of the third guide rod 234 is fixed to the first fixed portion 232 by a thread, and the other end of the third guide rod 234 abuts against the second fixed portion 233, so as to facilitate assembly and disassembly of the elastic buffer assembly 231 and the sliding rail 121. In addition, an end of the third guide rod 234 may be welded to the first fixed portion 232, and the other end may be welded to the second fixed portion 233.

In some embodiments, with continued reference to FIG. 27, the elastic buffer assembly 231 further includes a guide sleeve 165 slidably fitted over the third guide rod 234 and coupled to an end of the second elastic member 235 and the driving unit 212. The driving unit 212 pushes the guide sleeve 236, such that the guide sleeve 236 drives the second elastic member 235 to slidably extend and retract on the third guide rod 234, so as to stably push the sliding rail 121 to slide. Exemplarily, with continued reference to FIG. 22, the first pushing member 216 of the driving unit 212 is provided with a first slot 237 engaged with the guide sleeve 236, and the guide sleeve 236 is driven to slidably extend and retract on the third guide rod 234 by the first pushing member 216.

In the first class of embodiments, two driving units 212 may be provided and drive the two sliding rails 121 to extend or retract respectively.

Figure 28:
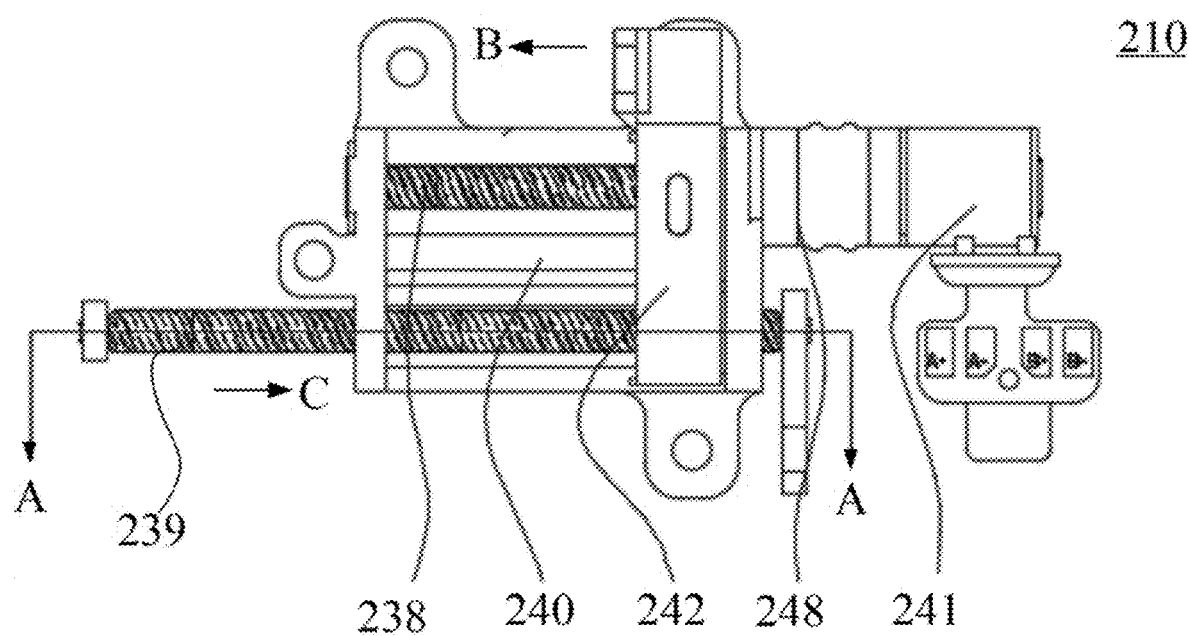
FIG. 28 shows a partial schematic structural diagram of a driving assembly according to an exemplary embodiment of the present disclosure.
Figure 29:
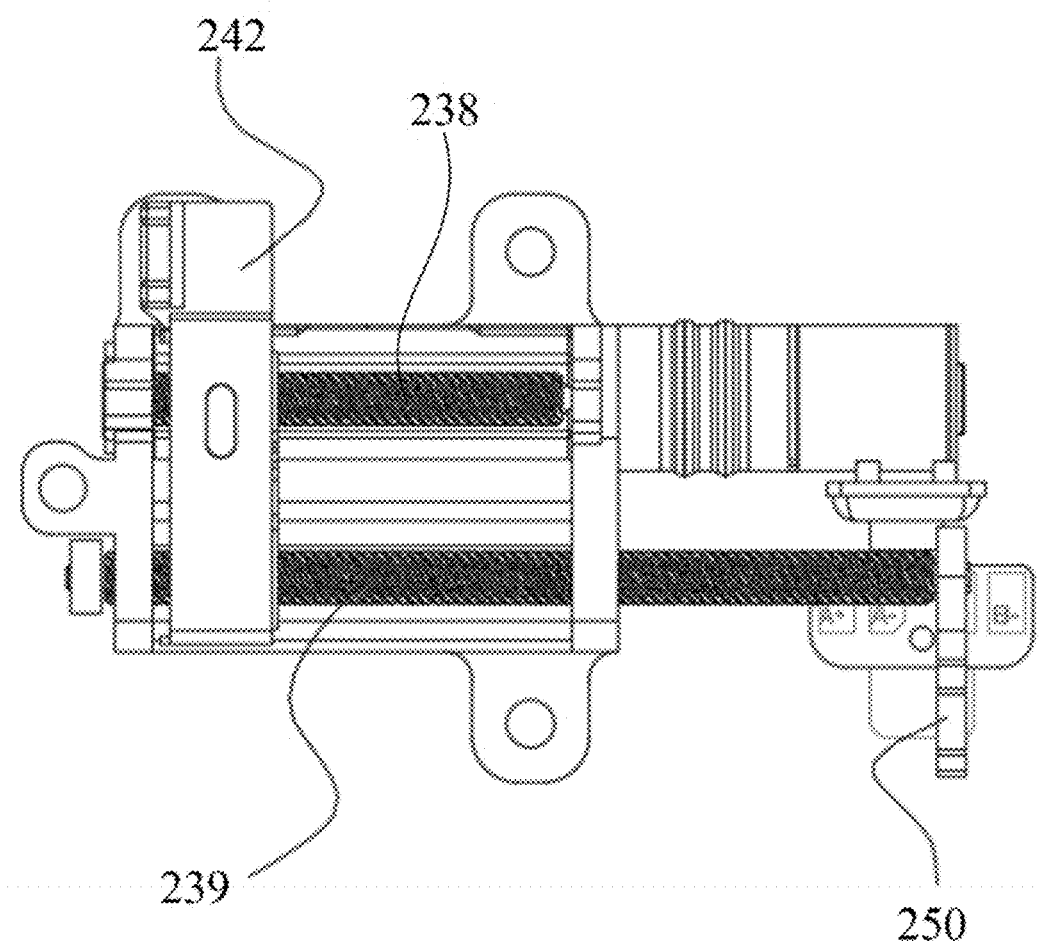
FIG. 29 shows a partial schematic structural diagram of a driving assembly according to an exemplary embodiment of the present disclosure.
Figure 30:
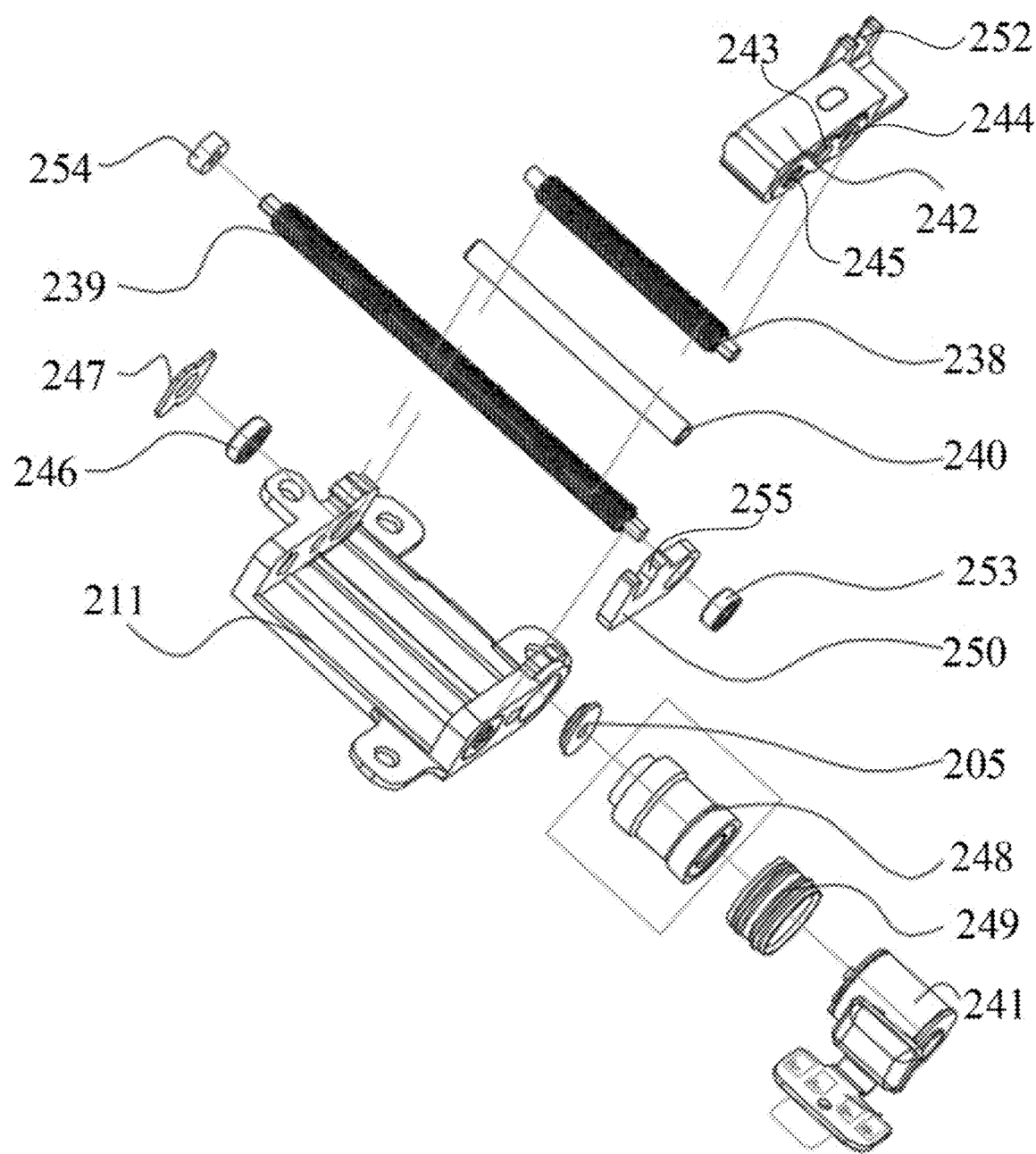
FIG. 30 shows a schematic exploded diagram of a driving assembly according to an exemplary embodiment of the present disclosure.

FIG. 28 shows a partial schematic structural diagram of a driving assembly 210 according to an exemplary embodiment of the present disclosure, FIG. 29 shows a partial schematic structural diagram of a driving assembly 210 according to an exemplary embodiment of the present disclosure, and FIG. 30 shows a schematic exploded diagram of a driving assembly 210 according to an exemplary embodiment of the present disclosure. In the second class of embodiments, with reference to FIGS. 28 to 30, at least two sliding rails 121 are provided; the driving unit 212 includes a second transmission lead screw 238, a third transmission lead screw 239, a second guide rod 240, a second driving member 241 and a second pushing member 242. The second transmission lead screw 238 and the second guide rod 240 are assembled to the driving assembly support 211, the third transmission lead screw 239 is axially movably assembled to the driving assembly support 211, and the second driving member 241 is configured to drive the second transmission lead screw 238 to rotate. The second pushing member 242 is provided with a second sliding hole 243, a second transmission hole 244 and a third transmission hole 245. The second sliding hole 243 is slidably fitted over the second guide rod 240, the second transmission hole 244 is drivingly coupled to the second transmission lead screw 238, and the third transmission hole 245 is drivingly coupled to the third transmission lead screw 239. The third transmission lead screw 239 and the second pushing member 242 have opposite moving directions, the second pushing member 242 is configured to drive one sliding rail 121 to slide, and the third transmission lead screw 239 is configured to drive the other sliding rail 121 to slide. For convenience of description, the sliding rail 121 driven by the second pushing member 242 is referred to as the first sliding rail 124, and the sliding rail 121 driven by the third transmission lead screw 239 is referred to as the second sliding rail 125. When the second driving member 241 drives the second transmission lead screw 238 to rotate, the rotating second transmission lead screw 238 drives the second pushing member 242 to move linearly along an axial direction of the second transmission lead screw 238, the second guide rod 240 provides guidance for the second pushing member 242 to ensure that the second pushing member 242 is moved stably, and the second pushing member 242 drives the first sliding rail 124 to slide. Meanwhile, the second pushing member 242 drives the third transmission lead screw 239 to move in a direction opposite to the moving direction of the second pushing member 242, and the third transmission lead screw 239 drives the second sliding rail 125 to move. It may be understood that, referring to FIG. 28, when the second pushing member 242 is moved in direction B, the third transmission lead screw 239 is moved in direction C, such that the second pushing member 242 and the third transmission lead screw 239 are in the state shown in FIG. 29. Due to the opposite moving directions of the second pushing member 242 and the third transmission lead screw 239, the first and second sliding rails 124, 125 are slidably extended away from each other, or slidably retracted towards each other. An inner wall of the second transmission hole 244 is provided with a transmission thread fitted with the second transmission lead screw 238 to enable the second pushing member 242 to be linearly moved under the driving action of the second transmission lead screw 238. An inner wall of the third transmission hole 245 is provided with a transmission thread fitted with the third transmission lead screw 239, such that when the second pushing member 242 is moved linearly, the third transmission lead screw 239 is linearly moved opposite to the second pushing member 242.

Exemplarily, the second and third transmission holes 244, 245 may have opposite thread directions, such that the second pushing member 242 and the third transmission lead screw 239 have opposite moving directions. Exemplarily, the second and third transmission lead screws 238, 239 as well as the second guide rod 240 have parallel axes.

Exemplarily, with continued reference to FIG. 30, an end of the second transmission lead screw 238 may be fitted in a second bearing 246, and the second bearing 246 is assembled to the driving assembly support 211 by a second bearing pressing plate 247, such that the second transmission lead screw 238 may be rotated. The second bearing pressing plate 247 is mainly configured to press the second bearing 246, and when not fixed by spot welding, the second bearing 246 may be pressed by the second bearing pressing plate 247 which may be fixed on the driving assembly support 211 by spot welding. The second bearing pressing plate 247 may be made of stainless steel.

In some embodiments, with continued reference to FIG. 30, the driving unit 212 further includes a second reduction gearbox 248 having an end coupled to the second transmission lead screw 238, and the other end coupled to the second driving member 241. The second reduction gearbox 248 may amplify torque of the second driving member 241 to drive the second transmission lead screw 238 to rotate, thereby causing the second pushing member 242 to move linearly on the second transmission lead screw 238. The second reduction gearbox 248 may have the same structure as the first reduction gearbox 221, and for the structure of the second reduction gearbox 248, reference may be made to the structure of the first reduction gearbox 221, which is not repeated herein. Exemplarily, the second reduction gearbox 248 is coupled to the second transmission lead screw 238 by a third lead screw bushing 205.

In some embodiments, with continued reference to FIG. 30, the driving unit 212 further includes a second shock absorption member 249 fitted over an outer surface of the second reduction gearbox 248 to absorb noises and shocks. Exemplarily, the second shock absorption member 249 is molded by injecting a soft rubber material.

Figure 31:
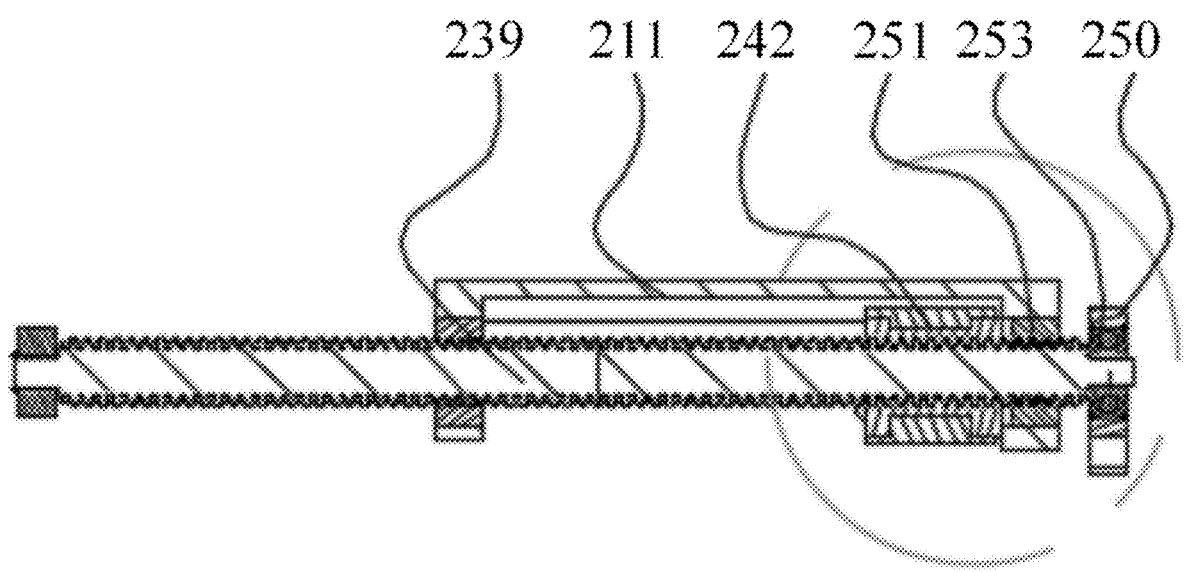
FIG. 31 shows a sectional view of the driving assembly in FIG. 28 taken along line A-A.
Figure 32:
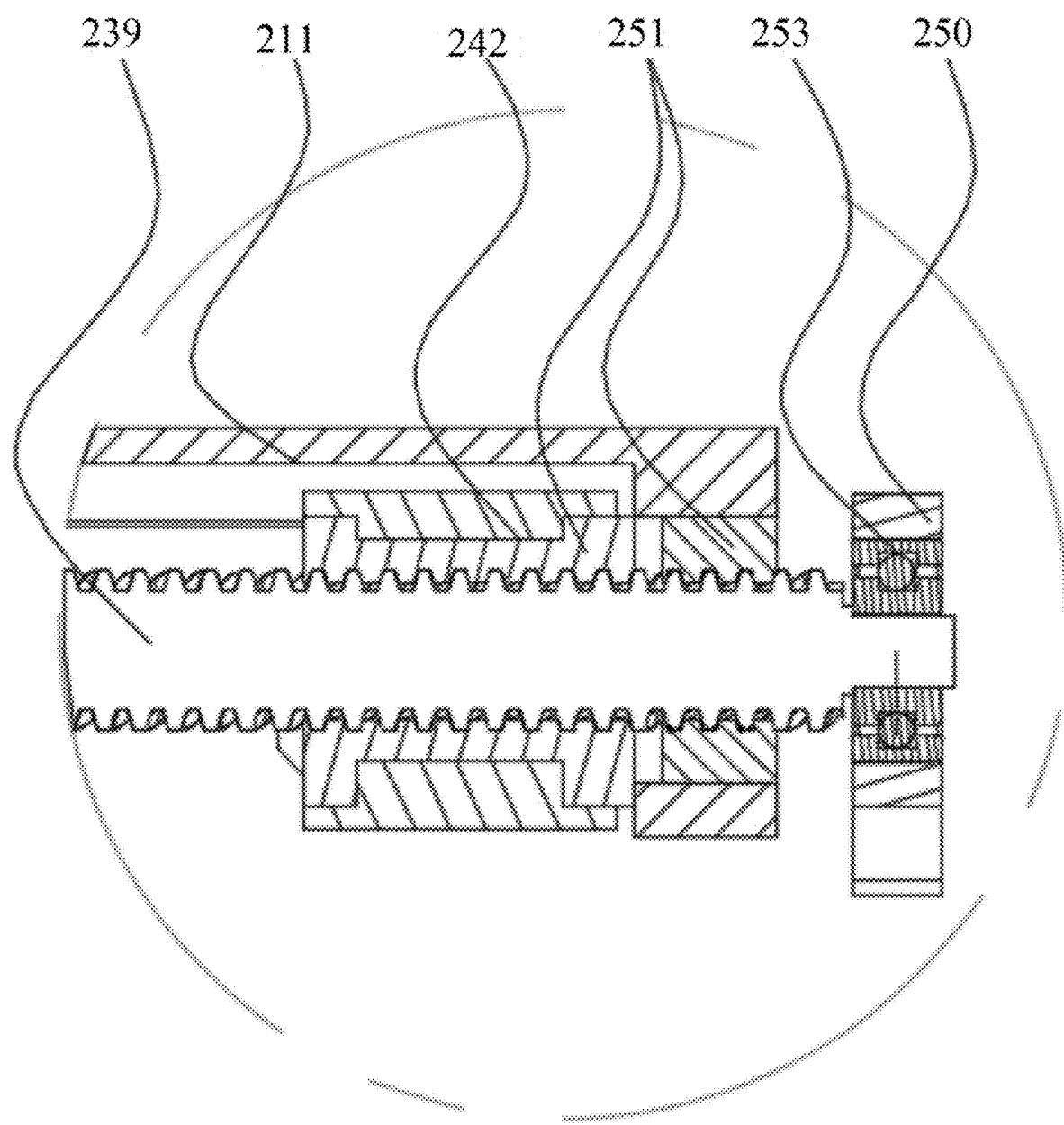
FIG. 32 shows a partial schematic enlarged diagram of the driving assembly in FIG. 31.

FIG. 31 shows a sectional view of the driving assembly 210 in FIG. 28 taken along line A-A, and FIG. 32 shows a partial schematic enlarged diagram of the driving assembly 210 in FIG. 31. In some embodiments, referring to FIGS. 30, 31 and 32, the driving unit 212 further includes an adapter 250, an end of the third transmission lead screw 239 is rotatably coupled to the adapter 250, and the third transmission lead screw 239 drives the sliding rail 121 to slide through the adapter 250. Exemplarily, the adapter 250 is fixedly provided with a third bearing 253, an end of the third transmission lead screw 239 is rotatably coupled to the third bearing 253, the other end of the third transmission lead screw 239 is provided with a limiting block 254, the driving assembly support 211 is provided with two opposite through holes, and after the third transmission lead screw 239 passes through the two through holes, the limiting block 254 and the adapter 250 cooperate to limit the third transmission lead screw 239. Exemplarily, the third bearing 253 is welded to an end of the third transmission lead screw 239 and the adapter 250, such that the third transmission lead screw 239 may be rotated relative to the adapter 250. Exemplarily, the inner wall of the third transmission hole 245 of the second pushing member 242 is formed by a second lubrication layer 251, and the second lubrication layer 251 may be made of polyoxymethylene (also called POM) to achieve a lubrication function, thus facilitating transmission between the third transmission hole 245 and the third transmission lead screw 239. The second pushing member 242 may employ powder metallurgy and plastic double-shot molding processes, and the inner wall of the second transmission hole 244 may also be made of polyoxymethylene (also called POM).

Figure 33:
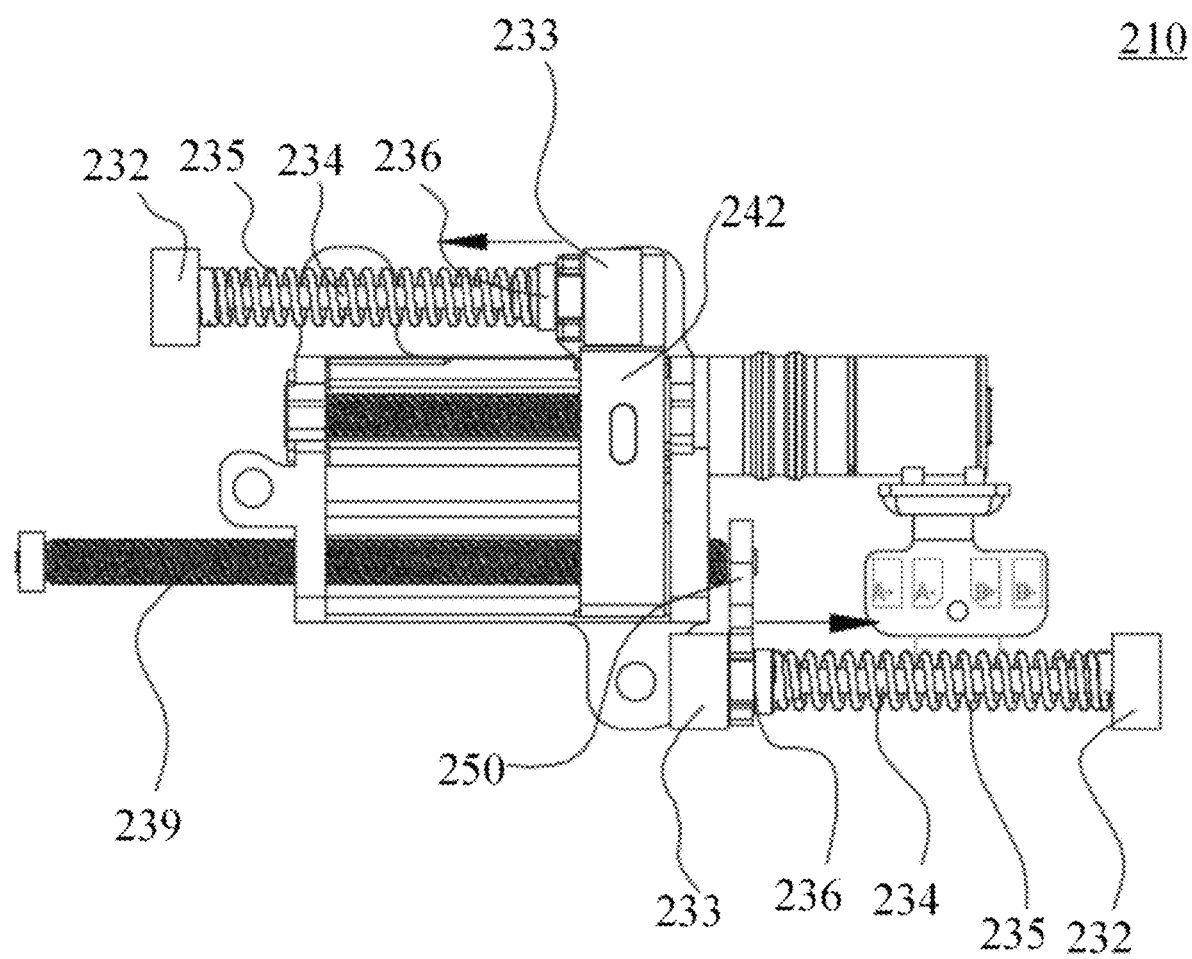
FIG. 33 shows a schematic structural diagram of a driving assembly according to an exemplary embodiment of the present disclosure.

FIG. 33 shows a schematic structural diagram of a driving assembly 210 according to an exemplary embodiment of the present disclosure. In some embodiments, with reference to FIGS. 30 and 33, the second pushing member 242 of the driving unit 212 is provided with a second slot 252 engaged with the guide sleeve 236, and the guide sleeve 236 provided at the first sliding rail 124 is driven to slidably extend and retract on the third guide rod 234 by the second pushing member 242. The adapter 250 may be provided with a third slot 255 which may be engaged with the guide sleeve 236, and the guide sleeve 236 provided at the second sliding rail 125 is driven to slidably extend and retract on the third guide rod 234 by the adapter 242.

In some embodiments, the electronic device further includes a controller 300 coupled to the driving unit 212 and configured to control the driving unit 212 to drive the sliding rail 121 to slide. Exemplarily, the controller 300 may include a CPU (Central Processing Unit) of the electronic device. Exemplarily, the first driving member 213 (second driving member 241) is coupled to the flexible circuit board, and the flexible circuit board is provided with the driving chip, and coupled to the controller 300 of the electronic device through an elastic piece or a BTB (board-to-board) connector, such that the controller 300 may control the first driving member 213 (second driving member 241) to work. In response to a tapping operation, the flexible screen 170 sends a first instruction to the controller 300, the controller 300 sends a first driving instruction to the driving chip of the first driving member 213 (second driving member 241) according to the first instruction, and the driving chip controls the first driving member 213 (second driving member 241) to drive the first transmission lead screw 214 (second transmission lead screw 238) to rotate around a first direction based on the first driving instruction, such that the sliding rail 121 is extended. In response to a tapping operation, the flexible screen 170 sends a second instruction to the controller 300, the controller 300 sends a second driving instruction to the driving chip of the first driving member 213 (second driving member 241) according to the second instruction, and the driving chip controls the first driving member 213 (second driving member 241) to drive the first transmission lead screw 214 (second transmission lead screw 238) to rotate around a second direction different from the first direction based on the second driving instruction, such that the sliding rail 121 is retracted.

Figure 34:
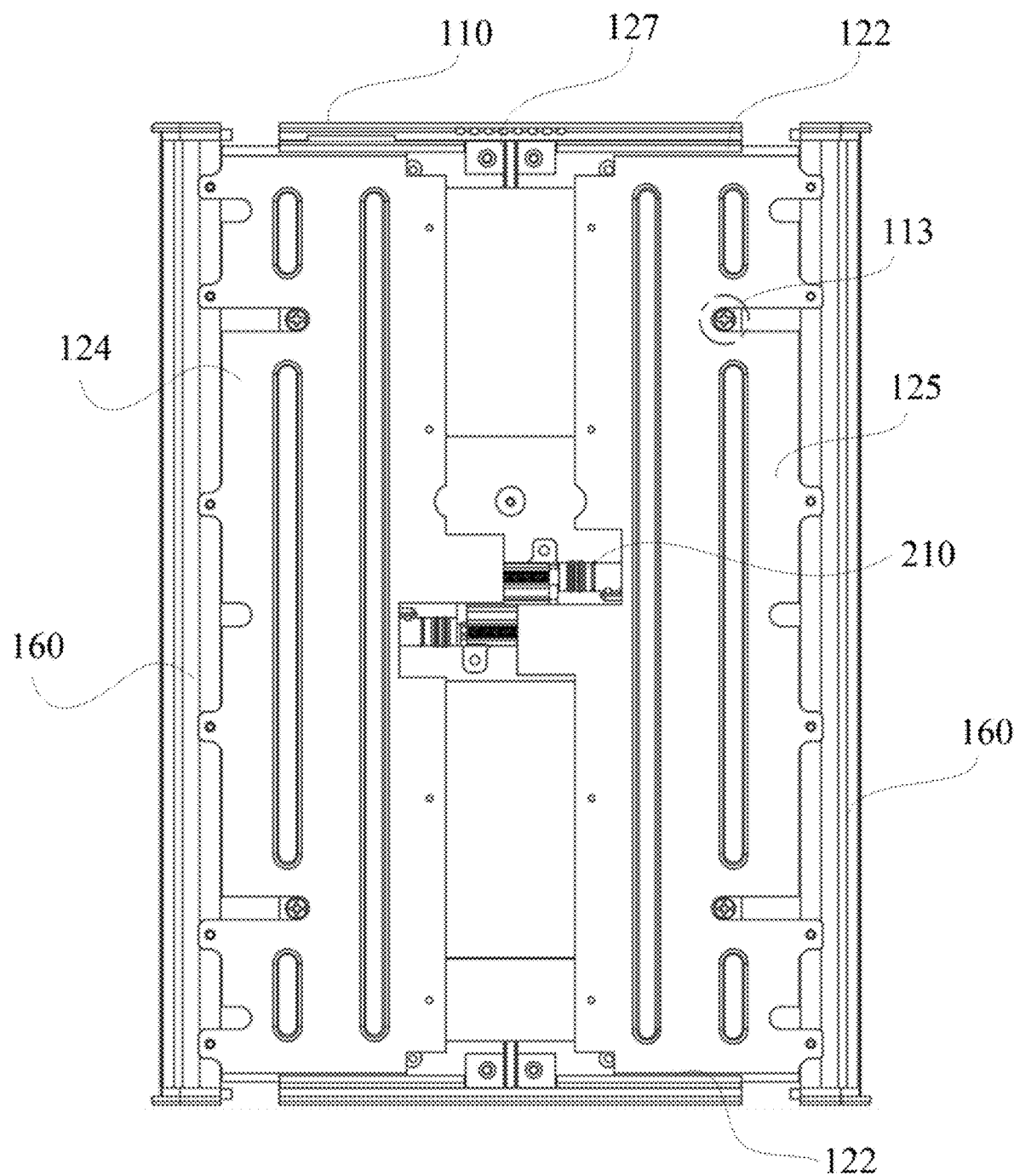
FIG. 34 shows a schematic diagram of a front surface of a partial structure of an electronic device according to an exemplary embodiment of the present disclosure.
Figure 35:
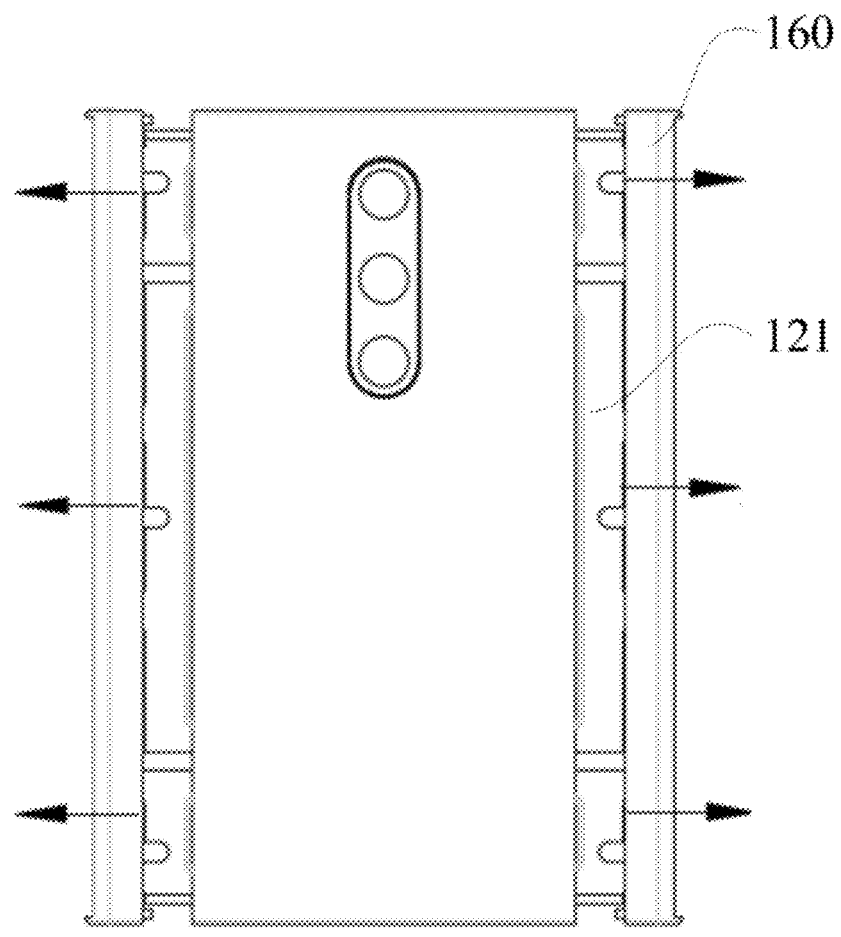
FIG. 35 shows a schematic diagram of a rear surface of a partial structure of an electronic device according to an exemplary embodiment of the present disclosure.
Figure 36:
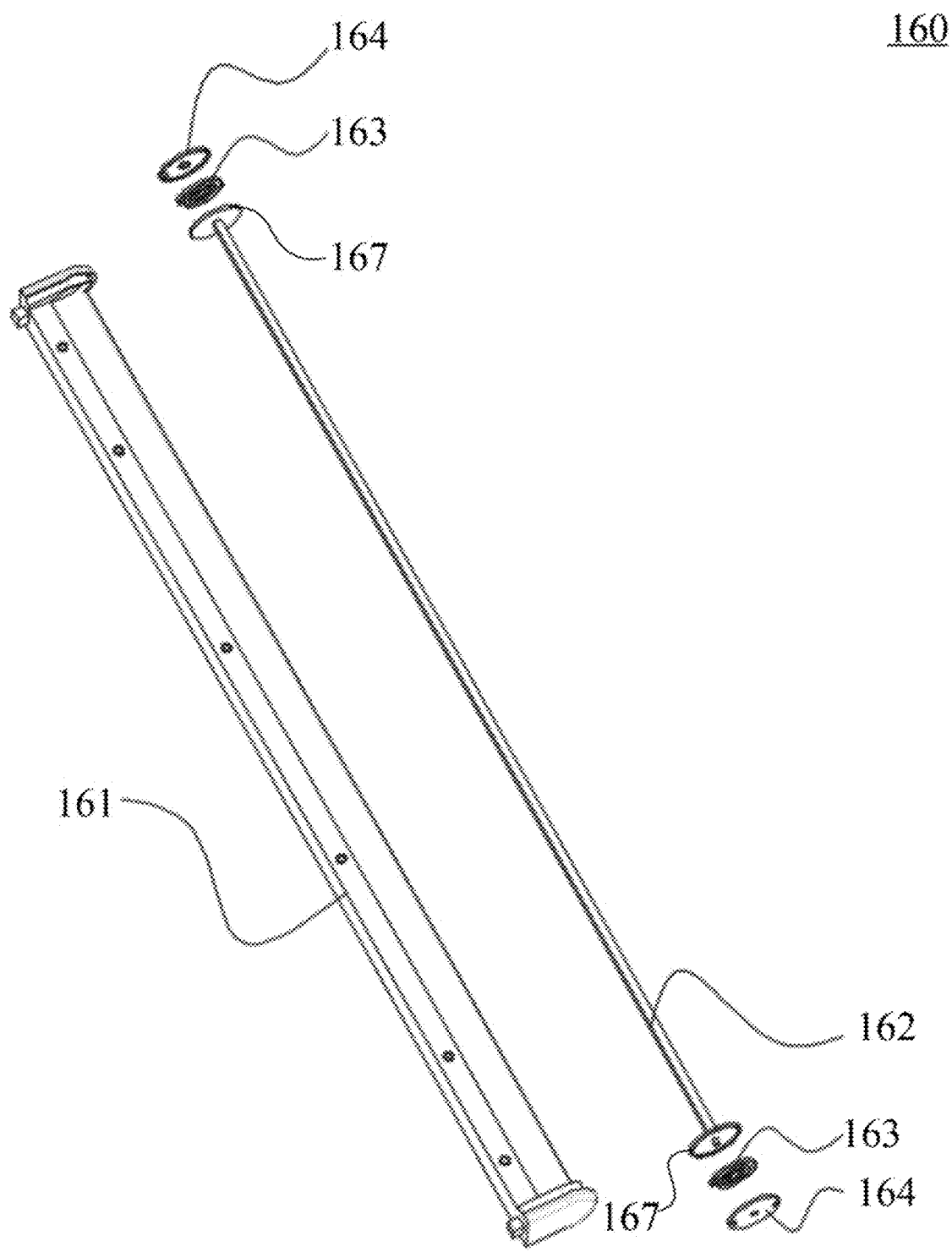
FIG. 36 shows a schematic exploded diagram of a reel assembly according to an exemplary embodiment of the present disclosure.
Figure 37:
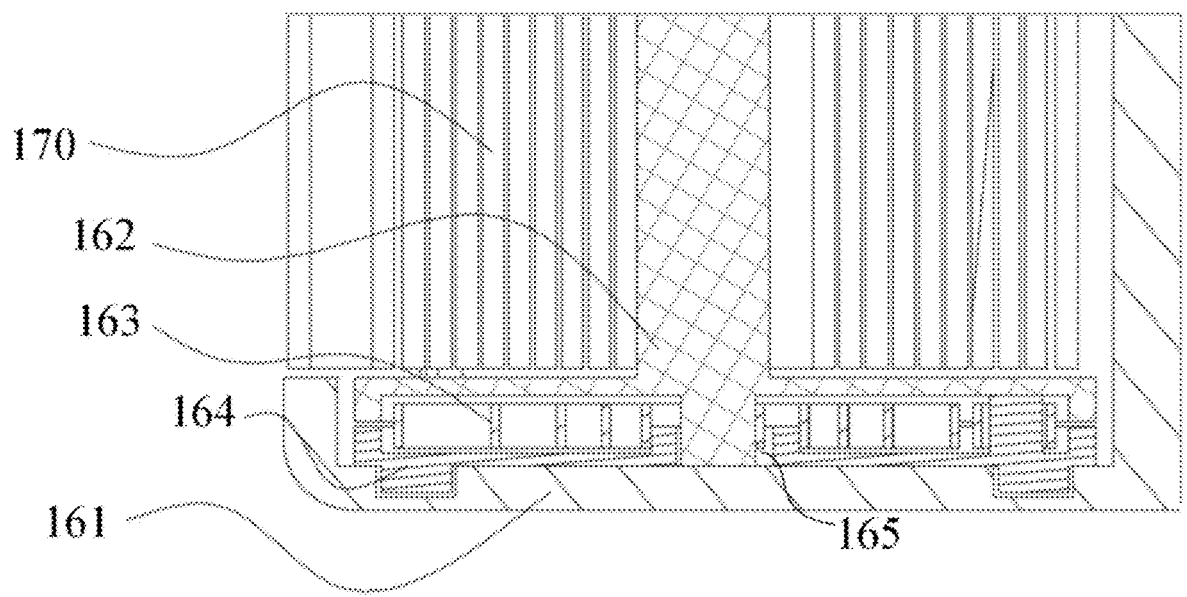
FIG. 37 shows a partial sectional view of a reel assembly according to an exemplary embodiment of the present disclosure.
Figure 38:
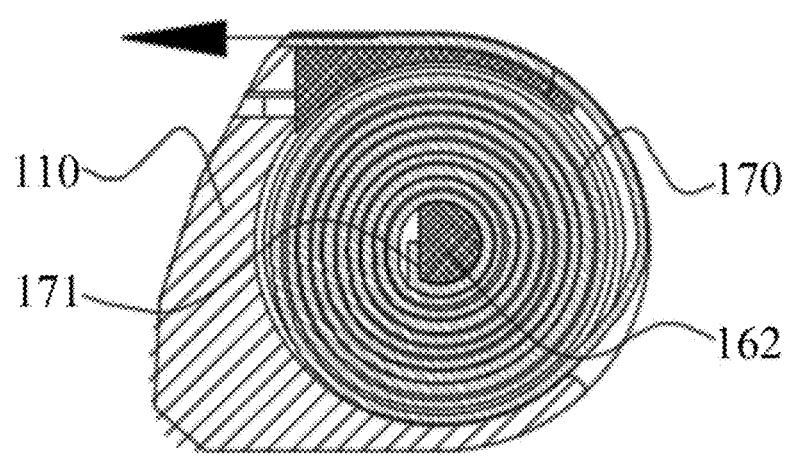
FIG. 38 shows a side view of a reel assembly according to an exemplary embodiment of the present disclosure.
Figure 39:
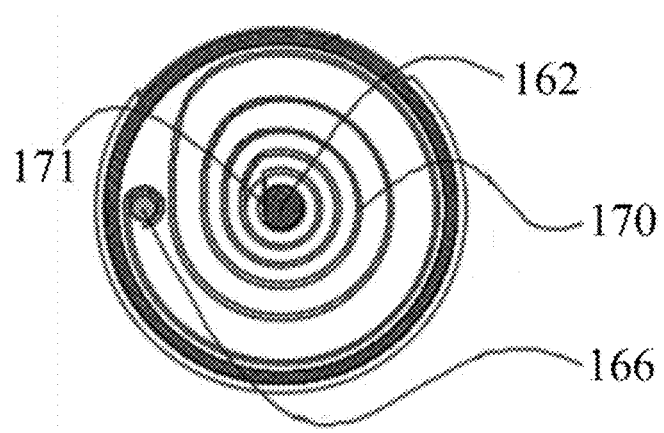
FIG. 39 shows a side view of a reel assembly according to an exemplary embodiment of the present disclosure.

FIG. 34 shows a schematic diagram of a front surface of a partial structure of an electronic device according to an exemplary embodiment of the present disclosure, FIG. 35 shows a schematic diagram of a rear surface of a partial structure of an electronic device according to an exemplary embodiment of the present disclosure, FIG. 36 shows a schematic exploded diagram of a reel assembly 160 according to an exemplary embodiment of the present disclosure, FIG. 37 shows a partial sectional view of a reel assembly 160 according to an exemplary embodiment of the present disclosure, FIG. 38 shows a side view of a reel assembly 160 according to an exemplary embodiment of the present disclosure, and FIG. 39 shows a side view of a reel assembly 160 according to an exemplary embodiment of the present disclosure. In some embodiments, with reference to FIGS. 34 to 39, the reel assembly 160 includes a reel support 161, a rotating shaft 162, and a first elastic member 163. The reel support 161 is fixed to the edge of the sliding rail 121, the rotating shaft 162 is rotatably assembled to the reel support 161, the first elastic member 163 is coupled to the rotating shaft 162, and configured to restore the rotating shaft 162, and part of the flexible screen 170 is wound around the rotating shaft 252 through the winding end 171. When the sliding rail 121 is slid outwards from the housing assembly 110, due to fixation of part of the flexible screen 170 to the housing assembly 110, the part of the flexible screen 170 wound around the rotating shaft 162 is released under the driving action of extension of the sliding rail 121, such that the flexible screen 170 is in the extended state, referring to FIG. 39. When the sliding rail 121 is slid from the outside to the housing assembly 110, the rotating shaft 162 is rotated under the restoring action of the first elastic member 163, such that part of the flexible screen 170 is wound around the rotating shaft 162, and the flexible screen 170 is in the retracted state, referring to FIG. 38. Exemplarily, the reel support 161 may be fixed to the edge of the sliding rail 121 by a screw.

In some embodiments, with continued reference to FIGS. 36 and 37, the reel assembly 160 further includes a fixed end cap 164 fixed to the reel support 161, the fixed end cap 164 is provided with a shaft hole 165, and an end of the rotating shaft 162 is rotatably limited in the shaft hole 165. Thus, the rotating shaft 162 is rotatably assembled to the reel support 161.

In some embodiments, with continued reference to FIGS. 36 and 37, the first elastic member 163 includes a volute spiral spring having a first end coupled to the rotating shaft 162 and a second end coupled to the fixed end cap 164. The volute spiral spring is easy to obtain, and facilitates rotation and restoration of the rotating shaft 162. In at least one embodiment, when the sliding rail 121 is slid outwards from the housing assembly 110, the rotating shaft 162 is driven to rotate to release the flexible screen 170 outwards, and meanwhile, the rotating shaft 162 drives the volute spiral spring to rotate, such that the volute spiral spring generates an elastic force. When the sliding rail 121 is slid from the outside to the housing assembly 110, a direction of the elastic force generated by the volute spiral spring is opposite to the rotation direction of the rotating shaft 162, which causes the volute spiral spring to drive the rotating shaft 162 to rotate reversely, such that part of the flexible screen 170 is retracted to be wound around the rotating shaft 162.

In some embodiments, with continued reference to FIG. 39, a limiting pillar 166 is provided on the side of the fixed end cap 164 facing the volute spiral spring, and a second end of the volute spiral spring is coupled to the limiting pillar 166. The arrangement of the limiting pillar 166 facilitates coupling between the second end of the volute spiral spring and the fixed end cap 164. Exemplarily, the second end of the volute spiral spring may be fixed to the limiting pillar 166 by winding or welding.

In some embodiments, with continued reference to FIGS. 36 and 37, a rotating shaft disk 167 is fitted over the rotating shaft 162, and the volute spiral spring is located between the rotating shaft disk 167 and the fixed end cap 164. Thus, the volute spiral spring is stably limited between the rotating shaft disk 167 and the fixed end cap 164, which is beneficial for the volute spiral spring to rotate along with the rotating shaft 162 and to drive the rotating shaft 162 to rotate for restoration.

Figure 40:
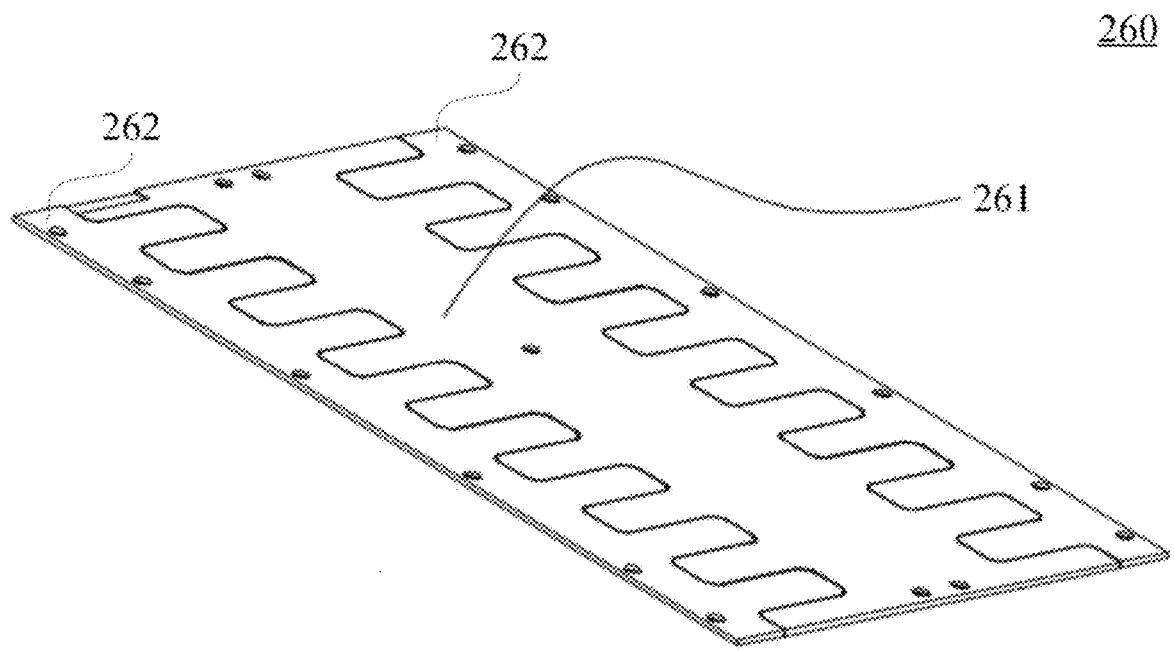
FIG. 40 shows a schematic diagram of retraction of a supporting plate assembly according to an exemplary embodiment of the present disclosure.
Figure 41:
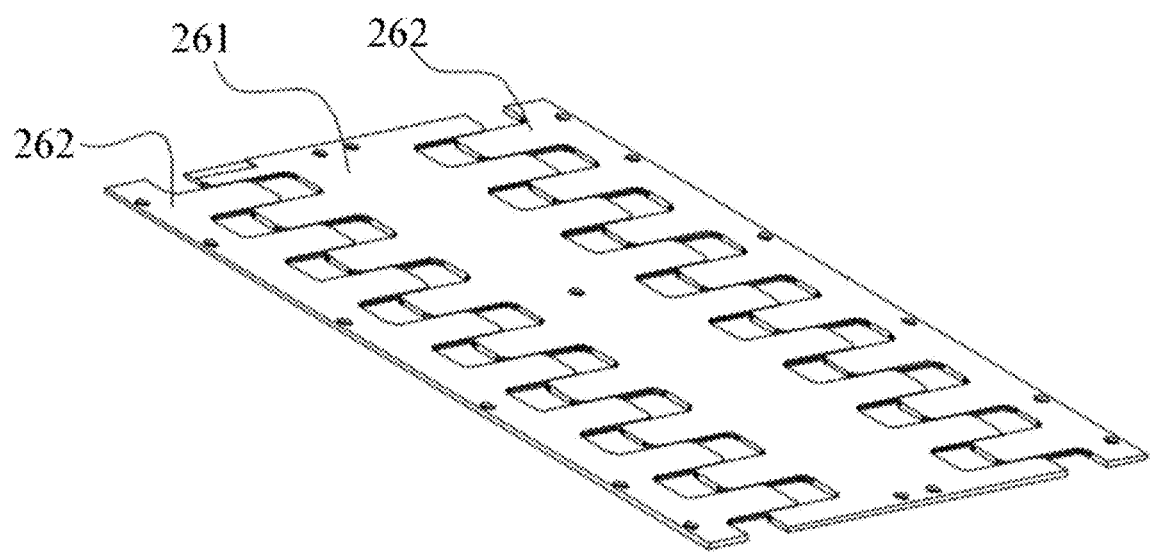
FIG. 41 shows a schematic diagram of extension of a supporting plate assembly according to an exemplary embodiment of the present disclosure.

FIG. 40 shows a schematic diagram of retraction of a supporting plate assembly 260 according to an exemplary embodiment of the present disclosure, and FIG. 41 shows a schematic diagram of extension of a supporting plate assembly 260 according to an exemplary embodiment of the present disclosure. In some embodiments, with reference to FIGS. 1, 2, 3, 40 and 41, the electronic device further includes the supporting plate assembly 260 provided between the sliding rail assembly 120 and the flexible screen 170. The supporting plate assembly 260 includes a fixed supporting plate 261 and at least one movable supporting plate 262, the fixed supporting plate 261 is fixed to the housing assembly 110, the movable supporting plate 262 is slidably coupled to the fixed supporting plate 261, and further coupled to the sliding rail 121. Part of the flexible screen 170 is fixed to the fixed supporting plate 261, and the winding end 171 is wound across the movable supporting plate 262 around the reel assembly 121. It should be noted that the number of the movable supporting plates 262 may be equal to the number of the sliding rails 121, and the movable supporting plates 262 are coupled to the sliding rails 121 in one-to-one correspondence. Exemplarily, the movable supporting plate 262 includes a first movable supporting plate and a second movable supporting plate which are arranged oppositely, the first movable supporting plate is coupled to the first sliding rail 124, and the second movable supporting plate is coupled to the second sliding rail 125. The supporting plate assembly 260 is configured to support the flexible screen 170 to ensure that the flexible screen 170 does not collapse in both the extended and retracted states. In FIG. 3, the fixed supporting plate 261 includes a second region 204, and the flexible screen 170 is glued to the second region 204.

In some embodiments, a surface of the fixed supporting plate 261 facing the flexible screen 170 is flush with a surface of the movable supporting plate 262 facing the flexible screen 170. Thus, the flexible screen 170 may perform flat display in both extended and retracted states.

Figure 42:
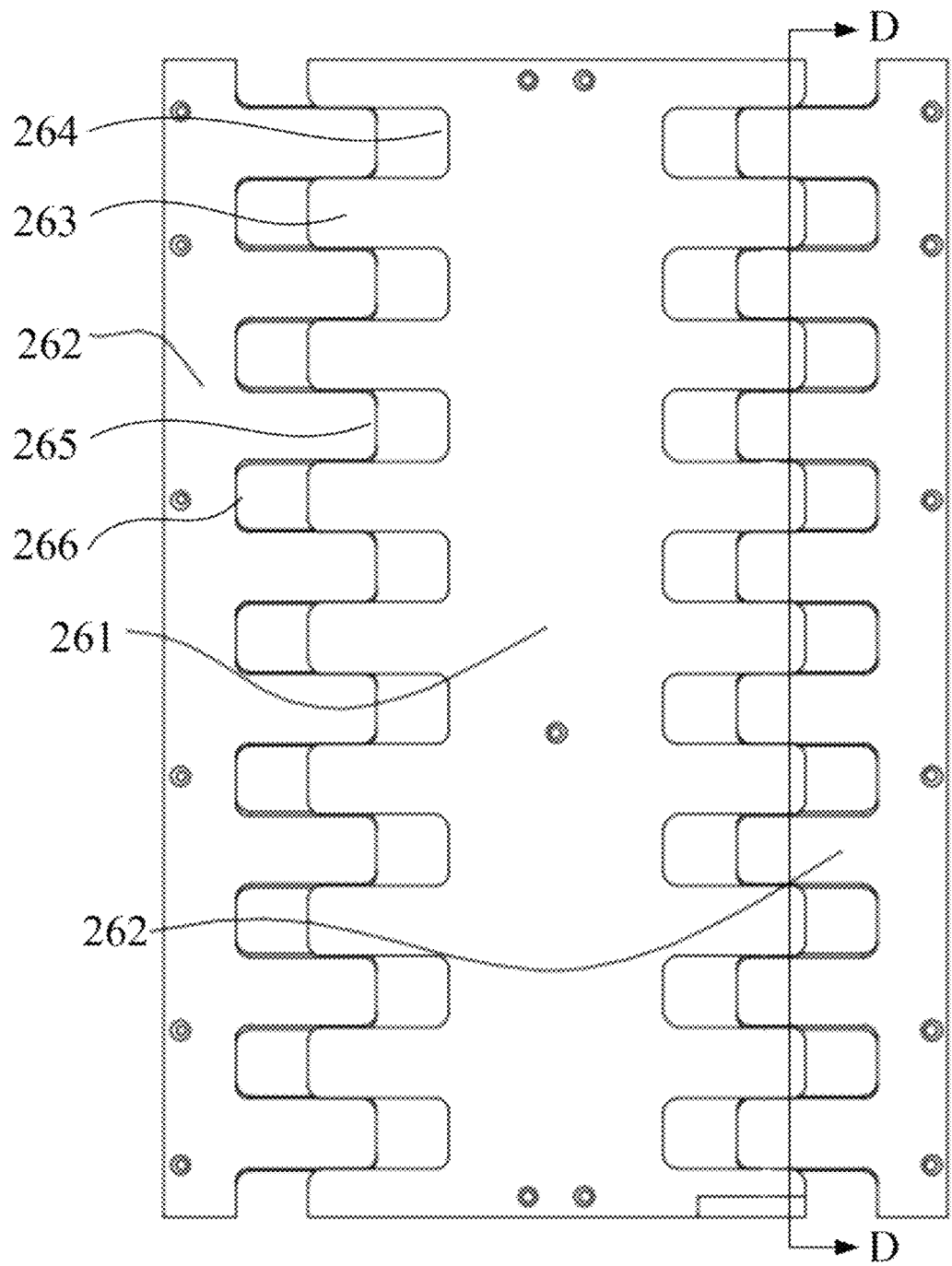
FIG. 42 shows a schematic diagram of extension of a supporting plate assembly according to an exemplary embodiment of the present disclosure.

FIG. 42 shows a schematic diagram of extension of a supporting plate assembly 260 according to an exemplary embodiment of the present disclosure. In some embodiments, referring to FIG. 42, an edge of the fixed supporting plate 261 is provided with a plurality of first protrusions 263 and a plurality of first recesses 264; an edge of the movable supporting plate 262 is provided with a plurality of second protrusions 265 and a plurality of second recesses 266, the second protrusions 265 are slidably coupled to the first recesses 264, and the second recesses 266 are slidably coupled to the first protrusions 263. Thus, the first protrusions 263 are fitted with the second recesses 266, and the first recesses 264 is fitted with the second protrusions 265, such that surfaces of the movable and fixed supporting plates 262, 261 are flush after the supporting plate assembly 260 is extended, thus achieving a flat supporting effect on the flexible screen 170. Exemplarily, the plurality of first protrusions 263 and the plurality of first recesses 264 are arranged alternately, and the plurality of second protrusions 265 and the plurality of second recesses 266 are arranged alternately.

In some embodiments, one of an edge of the first protrusion 263 and an edge of the second recess 266 is provided with a third sliding groove, and the other is provided with a first sliding portion matched with the third sliding groove; and one of an edge of the second protrusion 265 and an edge of the first recess 264 is provided with a fourth sliding groove, and the other edge is provided with a second sliding portion matched with the fourth sliding groove, thus facilitating surface flatness of the supporting plate assembly 260. Exemplarily, a cross section of the third sliding groove may have a T-groove structure, and the first sliding portion may have a structure matched with the third sliding groove. Exemplarily, a cross section of the fourth sliding groove may have a T-groove structure, and the second sliding portion may have a structure matched with the fourth sliding groove.

Figure 43:
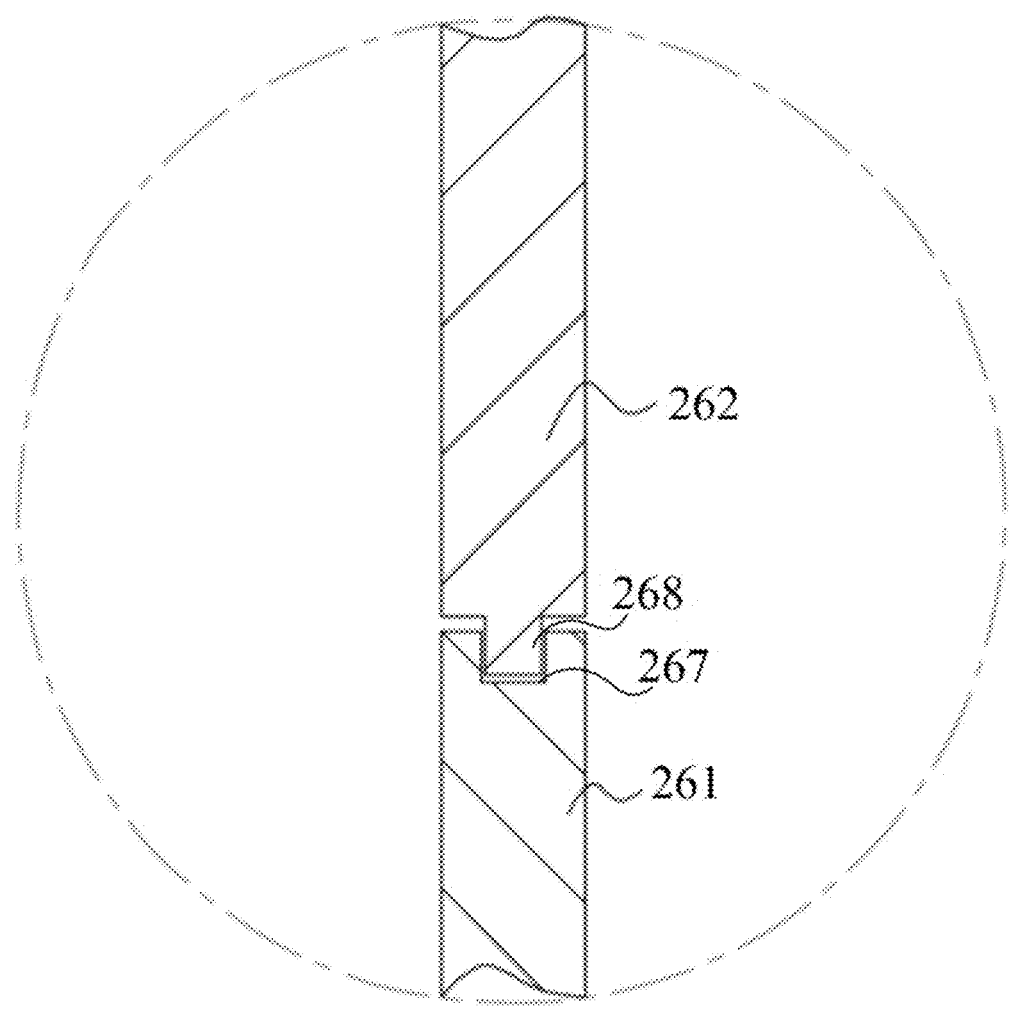
FIG. 43 is a partial enlarged view of the supporting plate assembly in FIG. 42 taken along line D-D.

FIG. 43 is a partial enlarged view of the supporting plate assembly 260 in FIG. 42 taken along line D-D. With continued reference to FIG. 43, the fixed supporting plate 261 may be provided with a third sliding groove 267 or a fourth sliding groove, and the movable supporting plate 262 may be provided with a first sliding portion 268 matched with the third sliding groove 267 or a second sliding portion matched with the fourth sliding groove.

Figure 44:
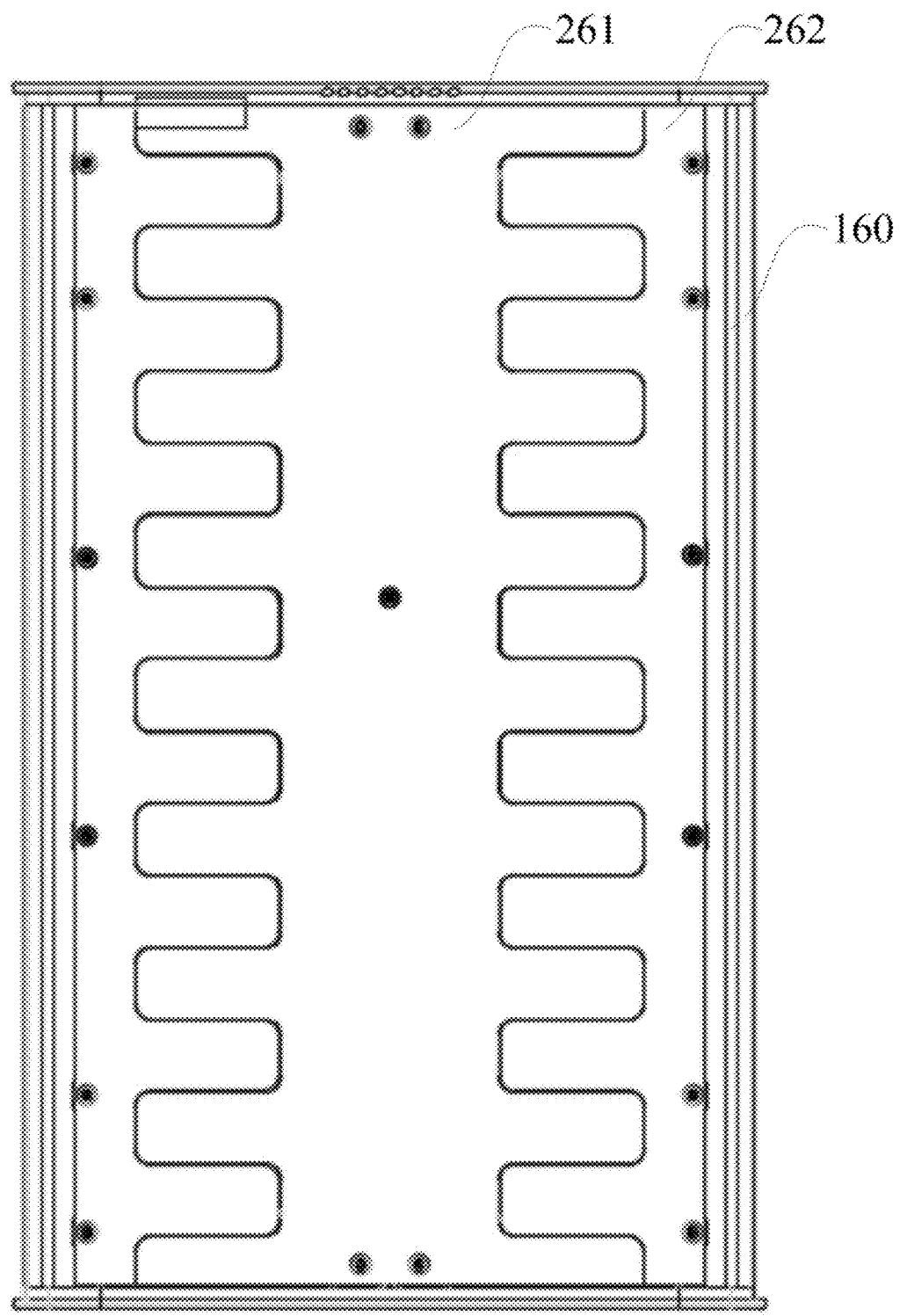
FIG. 44 shows a partial schematic structural diagram of an electronic device when a flexible screen is in a retracted state according to an exemplary embodiment of the present disclosure.
Figure 45:
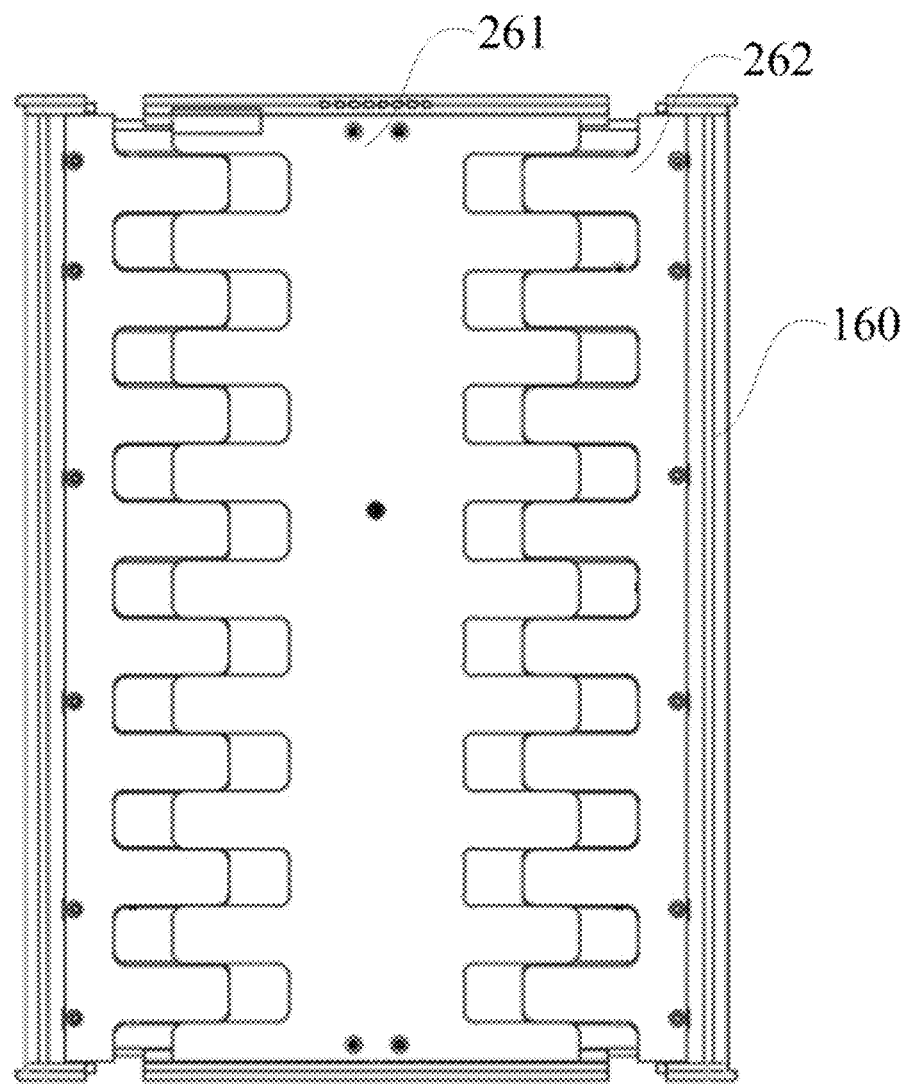
FIG. 45 shows a partial schematic structural diagram of an electronic device when a flexible screen is in an extended state according to an exemplary embodiment of the present disclosure.

FIG. 44 shows a partial schematic structural diagram of an electronic device when a flexible screen 170 is in a retracted state according to an exemplary embodiment of the present disclosure, and FIG. 45 shows a partial schematic structural diagram of an electronic device when a flexible screen 170 is in an extended state according to an exemplary embodiment of the present disclosure. With reference to FIGS. 35, 44 and 45, when the sliding rail 121 is slid outwards from the housing assembly 110, the movable supporting plate 262 is driven to slide in a direction away from the fixed supporting plate 261, such that the flexible screen 170 is in the extended state. When the sliding rail 121 is slid from the outside to the housing assembly 110, the movable supporting plate 262 is driven to slide towards the fixed supporting plate 261, such that the flexible screen 170 is in the retracted state.

In conclusion, in the electronic device according to the embodiments of the present disclosure, the reel assembly 160 is fixed to the edge of the sliding rail 121 slidable outwards from the housing assembly 110, part of the flexible screen 170 is provided at the front surface of the sliding rail 121 and fixed to the housing assembly 110, the winding end 171 is wound around the reel assembly 160, and when the sliding rail 121 is slid outwards from the housing assembly 110, part of the flexible screen 170 is extended from the reel assembly 160, and then, the flexible screen 170 is in the extended state. When the sliding rail 121 is slid from the outside to the housing assembly 110, part of the flexible screen 170 is retracted to the reel assembly 160, and then, the flexible screen 170 is in the retracted state. The flexible screen 170 of the electronic device may be extended and retracted, such that the user may conveniently use screens with different sizes, thus improving user experiences; and compared with a foldable screen, the electronic device has a small volume and mass, and is convenient for the user to carry. The flexible screen 170 may be automatically extended and retracted by providing the driving assembly 210, and the driving assembly 210 has a flexible arrangement form. The reel assembly 160 has a simple structure, and facilitates extension and retraction of the flexible screen 170. The flexible screen 170 may perform flat display by the supporting plate assembly 260, and is prevented from collapsing during extension and retraction. The electronic device has a simple structure and is easy to realize mass production.

The above embodiments of the present disclosure may complement each other without conflict.

The above descriptions are merely embodiments of the disclosure and are not intended to restrict the disclosure. Any modification, equivalent replacement, or improvement made within the spirit and principle of the present disclosure shall be included in the protection scope of the present disclosure.

What is claimed is:

1. An electronic device, comprising:
    a housing assembly;
    a sliding rail assembly assembled to the housing assembly and comprising at least one sliding rail, the sliding rail comprising a front surface and a rear surface opposite to the front surface;
    at least one reel assembly fixed to an edge of the sliding rail slidable outwards from the housing assembly; and
    a flexible screen, a first part of the flexible screen being provided at the front surface of the sliding rail and fixed to the housing assembly, the flexible screen comprising at least one winding end, a second part of the flexible screen being extendably and retractably wound around the reel assembly through the winding end, and the sliding rail being configured to extend the second part of the flexible screen from the reel assembly when slid outwards from the housing assembly and to retract the second part of the flexible screen to the reel assembly when slid towards the housing assembly from an outside, wherein a limiting portion is provided at an edge of the housing assembly, and the sliding rail is provided with a limiting groove, and slid outwards from the housing assembly, such that the limiting portion is limited in the limiting groove.

2. The electronic device according to claim 1, wherein the reel assembly comprises a reel support, a rotating shaft and a first elastic member; and the reel support is fixed to the edge of the sliding rail, the rotating shaft is rotatably assembled to the reel support, the first elastic member is coupled to the rotating shaft, and configured to restore the rotating shaft, and the second part of the flexible screen is wound around the rotating shaft through the winding end.

3. The electronic device according to claim 2, wherein the reel assembly further comprises a fixed end cap fixed to the reel support, the fixed end cap is provided with a shaft hole, and an end of the rotating shaft is rotatably limited in the shaft hole.

4. The electronic device according to claim 3, wherein the first elastic member comprises a volute spiral spring having a first end coupled to the rotating shaft and a second end coupled to the fixed end cap.

5. The electronic device according to claim 4, wherein a limiting pillar is provided at a surface of the fixed end cap facing the volute spiral spring, and the second end is coupled to the limiting pillar.

6. The electronic device according to claim 4, wherein a rotating shaft disk is fitted over the rotating shaft, and the volute spiral spring is located between the rotating shaft disk and the fixed end cap.

7. The electronic device according to claim 1, wherein the sliding rail assembly further comprises at least one fixing member fixed to the housing assembly and provided with a first sliding groove, and the sliding rail has an end slidably limited in the first sliding groove.

8. The electronic device according to claim 7, wherein the sliding rail assembly further comprises a buffer limiting member provided at the fixing member and configured to abut against the sliding rail sliding towards the housing assembly from the outside.

9. The electronic device according to claim 1, wherein the electronic device further comprises a driving assembly assembled to the housing assembly, coupled to the sliding rail, and configured to drive the sliding rail to slide.

10. The electronic device according to claim 9, wherein the driving assembly comprises a driving assembly support fixed to the housing assembly and at least one driving unit assembled to the driving assembly support and configured to drive the sliding rail to slide.

11. The electronic device according to claim 10, wherein the driving unit comprises a first driving member, a first transmission lead screw, a first guide rod and a first pushing member;

the first transmission lead screw and the first guide rod are assembled to the driving assembly support, the first driving member is coupled to an end of the first transmission lead screw, and the first driving member is configured to drive the first transmission lead screw to rotate; and the first pushing member is provided with a first transmission hole and a first sliding hole, the first transmission hole is drivingly coupled to the first transmission lead screw, the first sliding hole is slidably fitted over the first guide rod, and the first pushing member is configured to push the sliding rail to slide.

12. The electronic device according to claim 10, wherein at least two sliding rails are provided, the driving unit comprises a second transmission lead screw, a third transmission lead screw, a second guide rod, a second driving member and a second pushing member, the second transmission lead screw and the second guide rod are assembled to the driving assembly support, the third transmission lead screw is axially movably assembled to the driving assembly support, and the second driving member is configured to drive the second transmission lead screw to rotate; and the second pushing member is provided with a second sliding hole, a second transmission hole and a third transmission hole, the second sliding hole is slidably fitted over the second guide rod, the second transmission hole is drivingly coupled to the second transmission lead screw, the third transmission hole is drivingly coupled to the third transmission lead screw, the third transmission lead screw and the second pushing member have opposite moving directions, the second pushing member is configured to drive one sliding rail to slide, and the third transmission lead screw is configured to drive another sliding rail to slide.

13. The electronic device according to claim 12, wherein the driving unit further comprises an adapter, an end of the third transmission lead screw is rotatably coupled to the adapter, and the third transmission lead screw drives the sliding rail to slide by the adapter.

14. The electronic device according to claim 10, wherein the driving assembly further comprises at least one elastic buffer assembly fixed to the sliding rail and coupled to the driving unit.

15. The electronic device according to claim 14, wherein the elastic buffer assembly comprises a first fixed portion, a second fixed portion, a third guide rod and a second elastic member; and the first and second fixed portions are fixed to the sliding rail, the third guide rod is fixed between the first and second fixed portions, the second elastic member is fitted over the third guide rod, and the driving unit pushes the second elastic member to extend and retract on the third guide rod.

16. The electronic device according to claim 15, wherein the elastic buffer assembly further comprises a guide sleeve slidably fitted over the third guide rod and coupled to an end of the second elastic member and the driving unit.

17. The electronic device according to claim 10, wherein the electronic device further comprises a controller coupled to the driving unit and configured to control the driving unit to drive the sliding rail to slide.

18. The electronic device according to claim 1, wherein the electronic device further comprises a supporting plate assembly provided between the sliding rail assembly and the flexible screen; and the supporting plate assembly comprises a fixed supporting plate and at least one movable supporting plate, the fixed supporting plate is fixed to the housing assembly, the movable supporting plate is slidably coupled to the fixed supporting plate, and further coupled to the sliding rail, the first part of the flexible screen is fixed to the fixed supporting plate, and the winding end is wound across the movable supporting plate around the reel assembly.

19. The electronic device according to claim 18, wherein an edge of the fixed supporting plate is provided with a plurality of first protrusions and a plurality of first recesses; and an edge of the movable supporting plate is provided with a plurality of second protrusions and a plurality of second recesses, the second protrusions are slidably coupled to the first recesses, and the second recesses are slidably coupled to the first protrusions.

20. An electronic device, comprising:

a housing assembly;

a sliding rail assembly assembled to the housing assembly and comprising at least one sliding rail, the sliding rail comprising a front surface and a rear surface opposite to the front surface;

at least one reel assembly fixed to an edge of the sliding rail slidable outwards from the housing assembly;

a flexible screen, a first part of the flexible screen being provided at the front surface of the sliding rail and fixed to the housing assembly, the flexible screen comprising at least one winding end, a second part of the flexible screen being extendably and retractably wound around the reel assembly through the winding end, and the sliding rail being configured to extend the second part of the flexible screen from the reel assembly when slid outwards from the housing assembly and to retract the second part of the flexible screen to the reel assembly when slid towards the housing assembly from an outside; and a supporting plate assembly provided between the sliding rail assembly and the flexible screen, wherein the supporting plate assembly comprises a fixed supporting plate and at least one movable supporting plate, the fixed supporting plate is fixed to the housing assembly, the movable supporting plate is slidably coupled to the fixed supporting plate, and further coupled to the sliding rail, the first part of the flexible screen is fixed to the fixed supporting plate, and the winding end is wound across the movable supporting plate around the reel assembly.

* * * * *